US 12,334,177 B2

(12) United States Patent
Tagami

(10) Patent No.: US 12,334,177 B2
(45) Date of Patent: Jun. 17, 2025

(54) SEMICONDUCTOR MEMORY DEVICE

(71) Applicant: Kioxia Corporation, Tokyo (JP)

(72) Inventor: Masayoshi Tagami, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 168 days.

(21) Appl. No.: 18/225,916

(22) Filed: Jul. 25, 2023

(65) Prior Publication Data

US 2023/0368818 A1 Nov. 16, 2023

Related U.S. Application Data

(63) Continuation of application No. PCT/JP2021/003888, filed on Feb. 3, 2021.

(51) Int. Cl.
| | |
|---|---|
| *G11C 5/06* | (2006.01) |
| *H01L 25/065* | (2023.01) |
| *H10B 41/10* | (2023.01) |
| *H10B 41/20* | (2023.01) |
| *H10B 43/10* | (2023.01) |
| *H10B 43/20* | (2023.01) |
| *H10B 80/00* | (2023.01) |

(52) U.S. Cl.
CPC .......... *G11C 5/063* (2013.01); *H01L 25/0657* (2013.01); *H10B 41/10* (2023.02); *H10B 41/20* (2023.02); *H10B 43/10* (2023.02); *H10B 43/20* (2023.02); *H10B 80/00* (2023.02); *H01L 2225/06506* (2013.01)

(58) Field of Classification Search
CPC .. G11C 5/063; G11C 5/04; G11C 5/06; H01L 25/0657; H01L 2225/06506; H01L 2225/0651; H01L 2225/06562; H01L 25/50; H01L 25/18; H10B 41/10; H10B 41/20; H10B 43/10; H10B 43/20; H10B 80/00; H10B 43/27; H10B 43/40
USPC ........................................................ 365/63
See application file for complete search history.

(56) References Cited

U.S. PATENT DOCUMENTS

| 10,665,580 B1 | 5/2020 | Hosoda et al. | |
|---|---|---|---|
| 10,665,581 B1 | 5/2020 | Zhou et al. | |
| 2002/0135056 A1* | 9/2002 | Arai | H01L 23/3135 |
| | | | 257/E23.126 |

(Continued)

FOREIGN PATENT DOCUMENTS

| JP | 2018026518 A | 2/2018 |
|---|---|---|
| JP | 2020102613 A | 7/2020 |

*Primary Examiner* — Fernando Hidalgo
(74) *Attorney, Agent, or Firm* — Holtz, Holtz & Volek PC

(57) ABSTRACT

A semiconductor memory device includes first and second chips. The first chip includes a first region and a second region. The first region includes memory cells, bit lines, word lines, and first bonding electrodes electrically connected to bit lines. The second region includes contacts electrically connected to word lines and second bonding electrodes electrically connected to contacts. The first bonding electrodes include a third bonding electrode and a fourth bonding electrode adjacent. The second bonding electrodes include a fifth bonding electrode and a sixth bonding electrode adjacent. A distance from a center position of the third bonding electrode to a center position of the fourth bonding electrode and a distance from a center position of the fifth bonding electrode to a center position of the sixth bonding electrode are matched in a range of from 90% to 110%.

16 Claims, 41 Drawing Sheets

(56) References Cited

U.S. PATENT DOCUMENTS

| | | | |
|---|---|---|---|
| 2004/0164385 A1* | 8/2004 | Kado | H01L 23/5386 |
| | | | 257/E23.079 |
| 2004/0227163 A1* | 11/2004 | Sakamoto | H01L 24/02 |
| | | | 257/341 |
| 2019/0043868 A1 | 2/2019 | Hasnat et al. | |
| 2019/0096842 A1 | 3/2019 | Fountain et al. | |
| 2020/0111810 A1 | 4/2020 | Tagami et al. | |
| 2020/0203329 A1 | 6/2020 | Kanamori et al. | |
| 2021/0027841 A1 | 1/2021 | Park et al. | |
| 2021/0343737 A1 | 11/2021 | Utsumi | |

* cited by examiner

SEMICONDUCTOR MEMORY DEVICE

CROSS-REFERENCE TO RELATED APPLICATIONS

This application is based upon and claims the benefit of PCT International Application No. PCT/JP2021/003888, filed on Feb. 3, 2021, the entire contents of which are incorporated herein by reference.

BACKGROUND

Field

Embodiments described herein relate generally to a semiconductor memory device.

Description of the Related Art

There has been known a semiconductor memory device that includes a first chip and a second chip bonded via a plurality of bonding electrodes.

DETAILED DESCRIPTION

Figure 1:
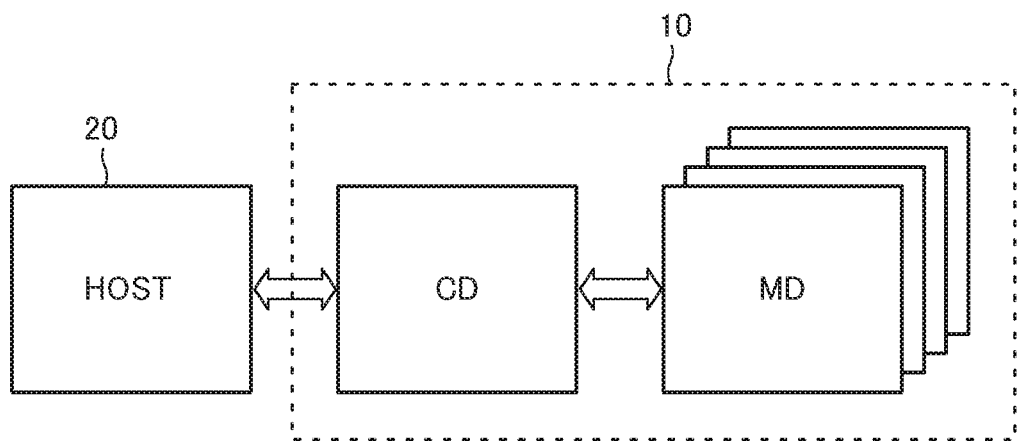
FIG. 1 is a schematic block diagram illustrating a configuration of a memory system 10 according to a first embodiment.

A semiconductor memory device according to one embodiment includes a first chip and a second chip bonded via a plurality of bonding electrodes. The first chip includes a first region and a second region. The first region includes a plurality of memory cells, a plurality of bit lines connected to the plurality of memory cells, a plurality of word lines connected to the plurality of memory cells, and a plurality of first bonding electrodes that are a part of the plurality of bonding electrodes and electrically connected to the plurality of bit lines. The second region includes a plurality of contacts electrically connected to the plurality of word lines and a plurality of second bonding electrodes that are a part of the plurality of bonding electrodes and electrically connected to the plurality of contacts. The plurality of first bonding electrodes include third bonding electrodes and fourth bonding electrodes adjacent in a first direction. The plurality of second bonding electrodes include fifth bonding electrodes and sixth bonding electrodes adjacent in the first direction. A distance from a center position in the first direction of the third bonding electrode to a center position in the first direction of the fourth bonding electrode and a distance from a center position in the first direction of the fifth bonding electrode to a center position in the first direction of the sixth bonding electrode are matched in a range of from 90% to 110%.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to a surface of the substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

When expressions such as "above" and "below" are used in this specification, for example, among two semiconductor substrates included in a memory die, one provided with a bonding pad electrode may be the semiconductor substrate at an upper side and one not provided with the bonding pad electrode may be the semiconductor substrate at a lower side. Furthermore, when referring to a configuration included in a memory die, for example, a direction approaching the semiconductor substrate at the upper side along the Z-direction may be referred to as above and a direction approaching the semiconductor substrate at the lower side along the Z-direction below may be referred to as below. A lower surface and a lower end of a certain configuration may mean a surface and an end portion on the semiconductor substrate side at the lower side of this configuration. An upper surface and an upper end of a certain configuration may mean a surface and an end portion of the semiconductor substrate at the upper side of this configuration. A surface intersecting with the X-direction or the Y-direction may be referred to as a side surface and the like.

First Embodiment

[Memory System 10]

FIG. 1 is a schematic block diagram illustrating a configuration of the memory system 10 according to the first embodiment.

The memory system 10, for example, reads, writes, and erases user data according to a signal transmitted from a host computer 20. The memory system 10 is, for example, any system that can store the user data including a memory chip, a memory card, and an SSD. The memory system 10 includes a plurality of memory dies MD that store the user data and a controller die CD connected to these plurality of memory dies MD and the host computer 20. The controller die CD includes, for example, a processor, a RAM, and the like, and performs a process, such as conversion between a logical address and a physical address, bit error detection/correction, a garbage collection (compaction), and a wear leveling.

Figure 2:
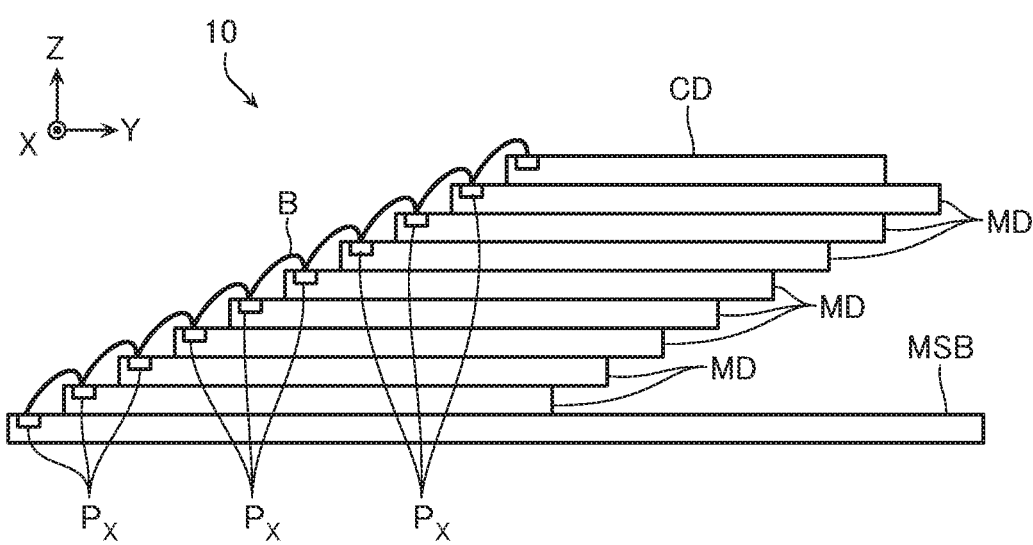
FIG. 2 is a schematic side view illustrating an exemplary configuration of the memory system 10.
Figure 3:
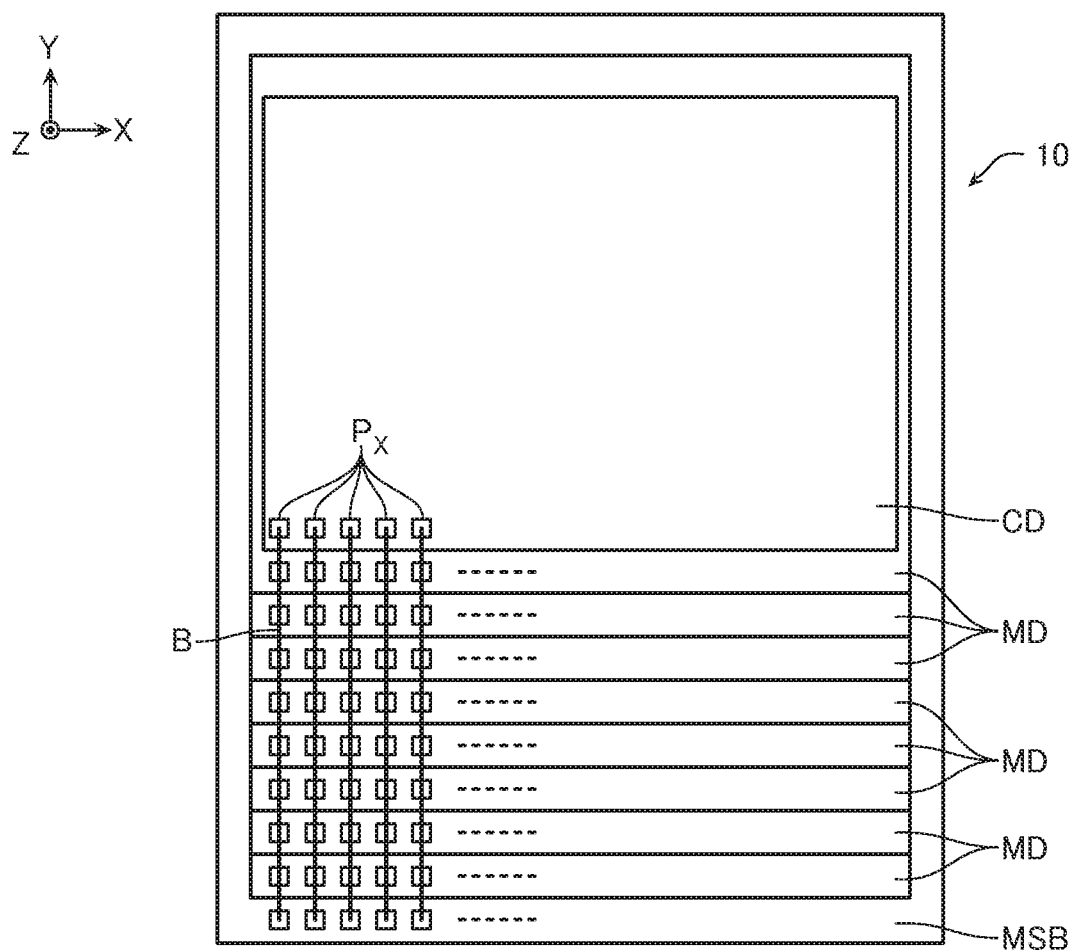
FIG. 3 is a schematic plan view illustrating an exemplary configuration of the memory system 10.

FIG. 2 is a schematic side view illustrating an exemplary configuration of the memory system 10 according to this embodiment. FIG. 3 is a schematic plan view illustrating the exemplary configuration. For convenience of description, FIG. 2 and FIG. 3 omit a part of a configuration.

As illustrated in FIG. 2, the memory system 10 according to this embodiment includes a mounting substrate MSB, the plurality of memory dies MD stacked on the mounting substrate MSB, and the controller die CD stacked on the memory die MD. On an upper surface of the mounting substrate MSB, a bonding pad electrode $P_X$ is disposed in a region at an end portion in the Y-direction, and a part of other regions is bonded to a lower surface of the memory die MD via an adhesive and the like. On an upper surface of the memory die MD, the bonding pad electrode $P_X$ is disposed in a region at an end portion in the Y-direction, and other regions are bonded to a lower surface of another memory die MD or the controller die CD via the adhesive and the like. On an upper surface of the controller die CD, the bonding pad electrode $P_X$ is disposed in a region at an end portion in the Y-direction.

As illustrated in FIG. 3, each of the mounting substrate MSB, the plurality of memory dies MD, and the controller die CD includes the plurality of bonding pad electrodes $P_X$ arranged in the X-direction. The respective plurality of bonding pad electrodes $P_X$ disposed in the mounting substrate MSB, the plurality of memory dies MD, and the controller die CD are mutually connected via bonding wires B.

Note that the configuration illustrated in FIG. 2 and FIG. 3 are merely an example, and the specific configuration is appropriately adjustable. For example, in the example illustrated in FIG. 2 and FIG. 3, the controller die CD is stacked on the plurality of memory dies MD, and these configurations are connected with the bonding wires B. In such a configuration, the plurality of memory dies MD and the controller die CD are included in one package. However, the controller die CD may be included in a package different from that of the memory dies MD. Additionally, the plurality of memory dies MD and the controller die CD may be connected to one another via through electrodes or the like, not via the bonding wires B.

[Structure of Memory Die MD]

Figure 4:
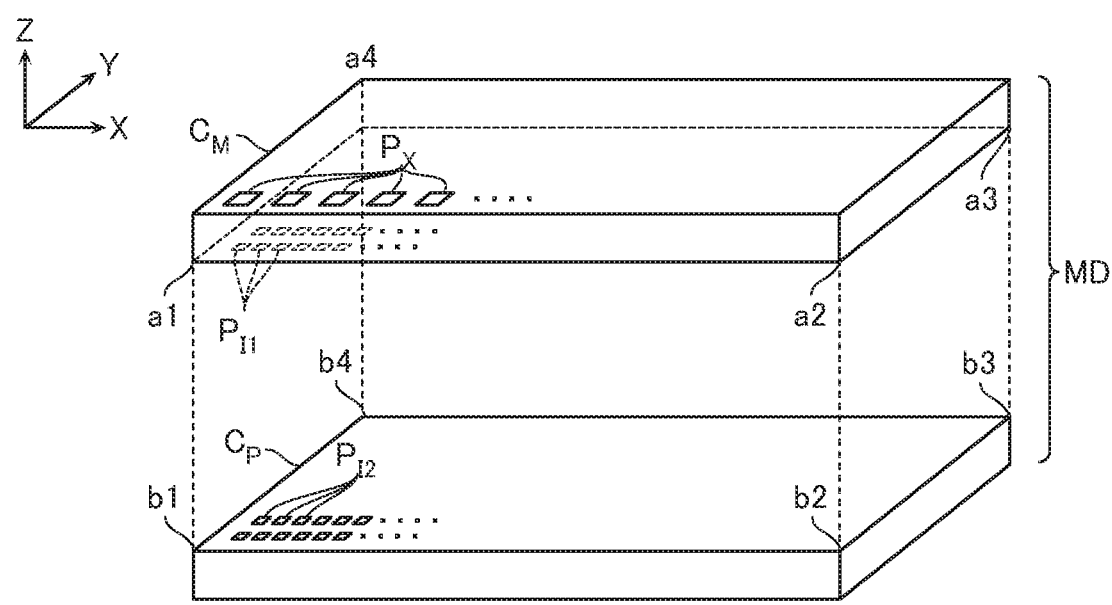
FIG. 4 is a schematic exploded perspective view illustrating an exemplary configuration of the semiconductor memory device according to this embodiment.

FIG. 4 is a schematic exploded perspective view illustrating an exemplary configuration of the semiconductor memory device according to this embodiment. As illustrated in FIG. 4, the memory die MD includes a chip $C_M$ including a memory cell array MCA and a chip $C_P$ including a peripheral circuit.

On the upper surface of the chip $C_M$, the plurality of bonding pad electrodes $P_X$ are disposed. On the lower surface of the chip $C_M$, a plurality of bonding electrodes $P_{I1}$ are disposed. On the upper surface of the chip $C_P$, a plurality of bonding electrodes $P_{I2}$ are disposed. Hereinafter, in the chip $C_M$, the surface on which the plurality of bonding electrodes $P_{I1}$ are disposed is referred to as a front surface and a surface on which the plurality of bonding pad electrodes $P_X$ are disposed is referred to as a back surface. In the chip $C_P$, a surface on which the plurality of bonding electrodes $P_{I2}$ are disposed is referred to as a front surface and a surface at the opposite side of the front surface is referred to as a back surface. In the example of the drawing, the front surface of the chip $C_P$ is disposed above the back surface of the chip $C_P$ and the back surface of the chip $C_M$ is disposed above the front surface of the chip $C_M$.

The chip $C_M$ and the chip $C_P$ are disposed such that the front surface of the chip $C_M$ is opposed to the front surface of the chip $C_P$. Each of the plurality of bonding electrodes $P_{I1}$ is disposed corresponding to each of the plurality of bonding electrodes $P_{I2}$ and is disposed at positions where the plurality of bonding electrodes $P_{I1}$ can be bonded to the plurality of bonding electrodes $P_{I2}$. The bonding electrodes $P_{I1}$ and the bonding electrodes $P_{I2}$ function as bonding electrodes for bonding the chip $C_M$ and the chip $C_P$ and electrically conducting them.

In the example of FIG. 4, corner portions a1, a2, a3, a4 of the chip $C_M$ correspond to corner portions b1, b2, b3, b4 of the chip $C_P$, respectively.

Figure 5:
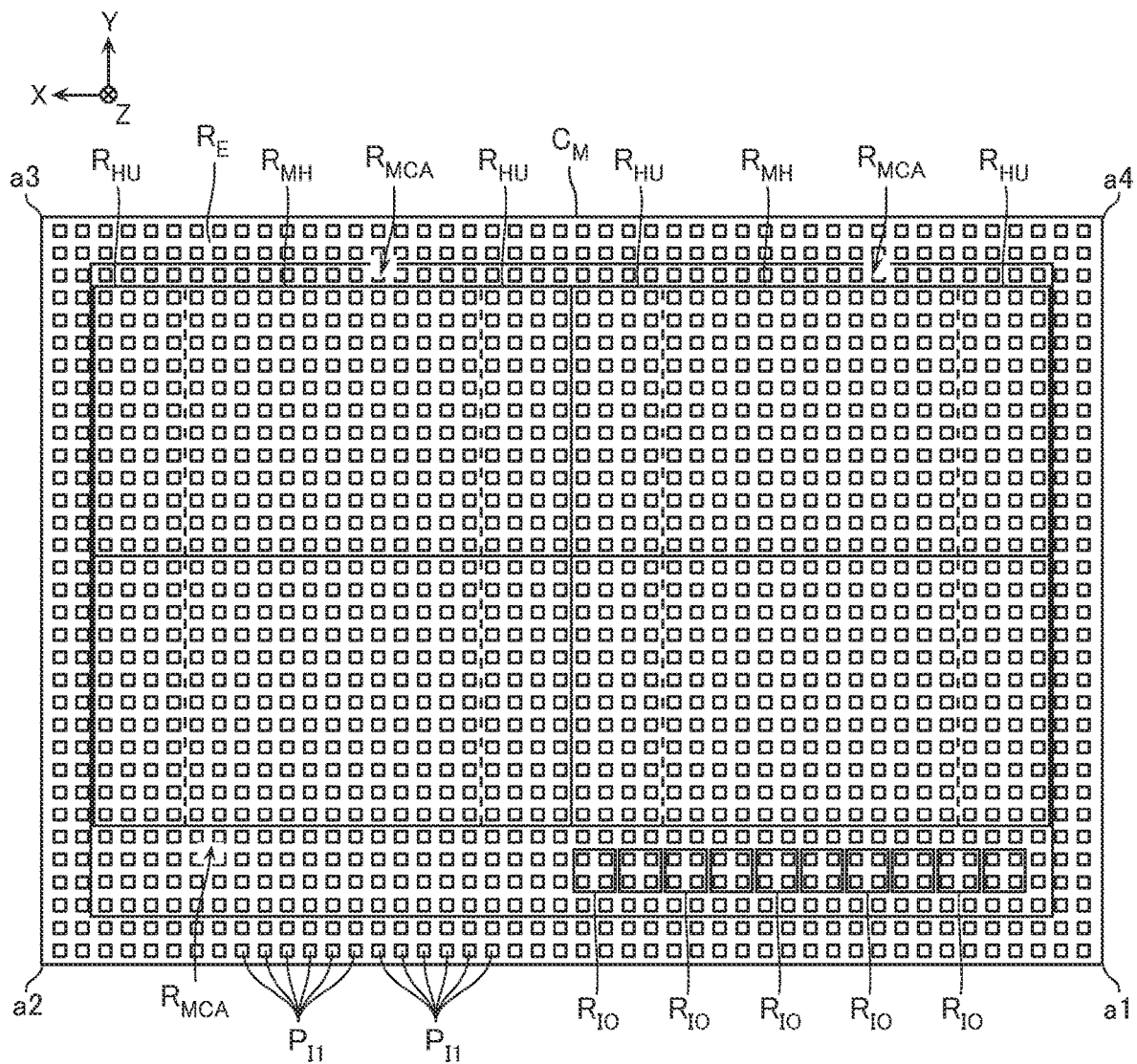
FIG. 5 is a schematic bottom view illustrating an exemplary configuration of a chip $C_M$.
Figure 6:
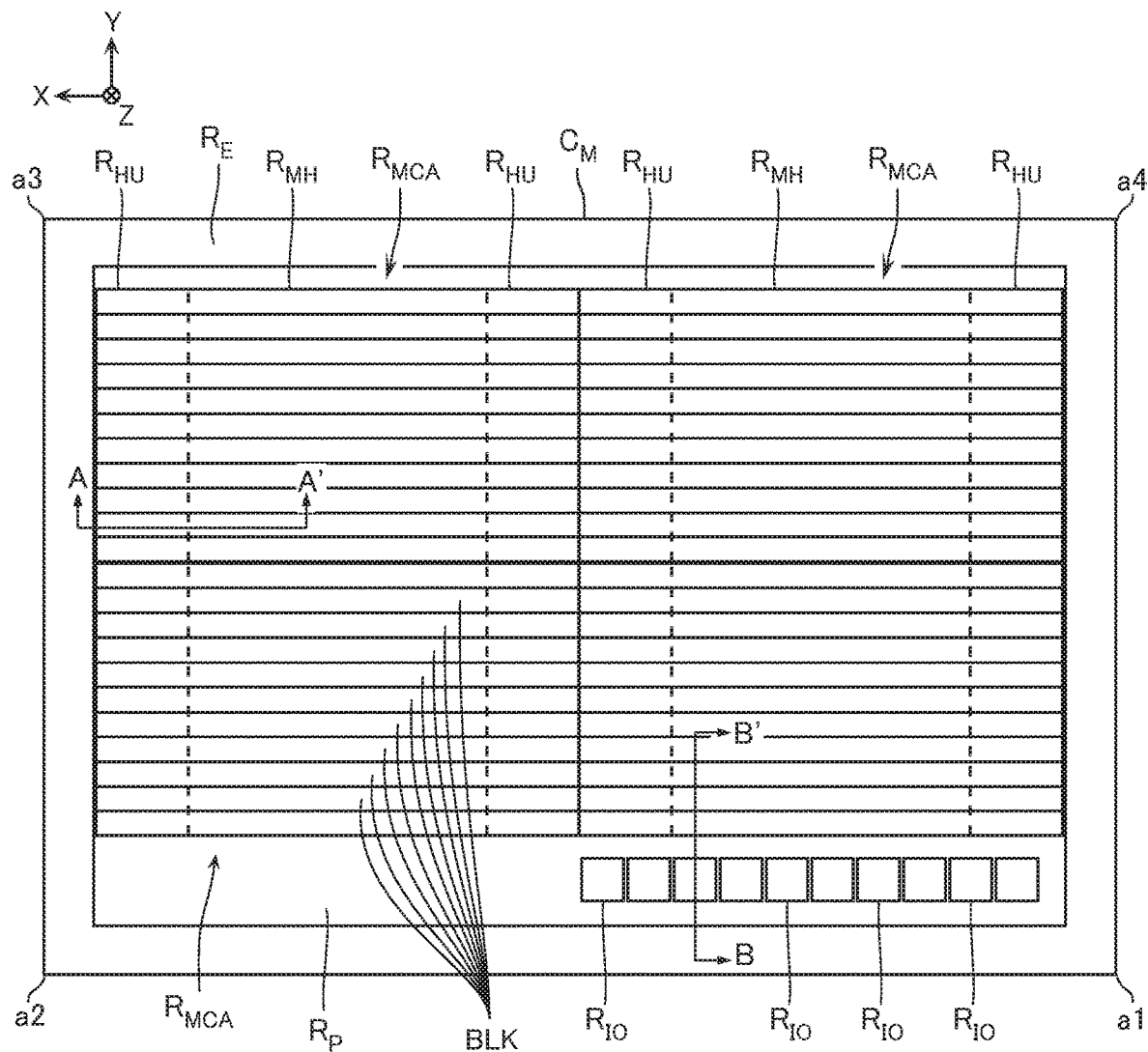
FIG. 6 is a schematic bottom view illustrating an exemplary configuration of the chip $C_M$.
Figure 7:
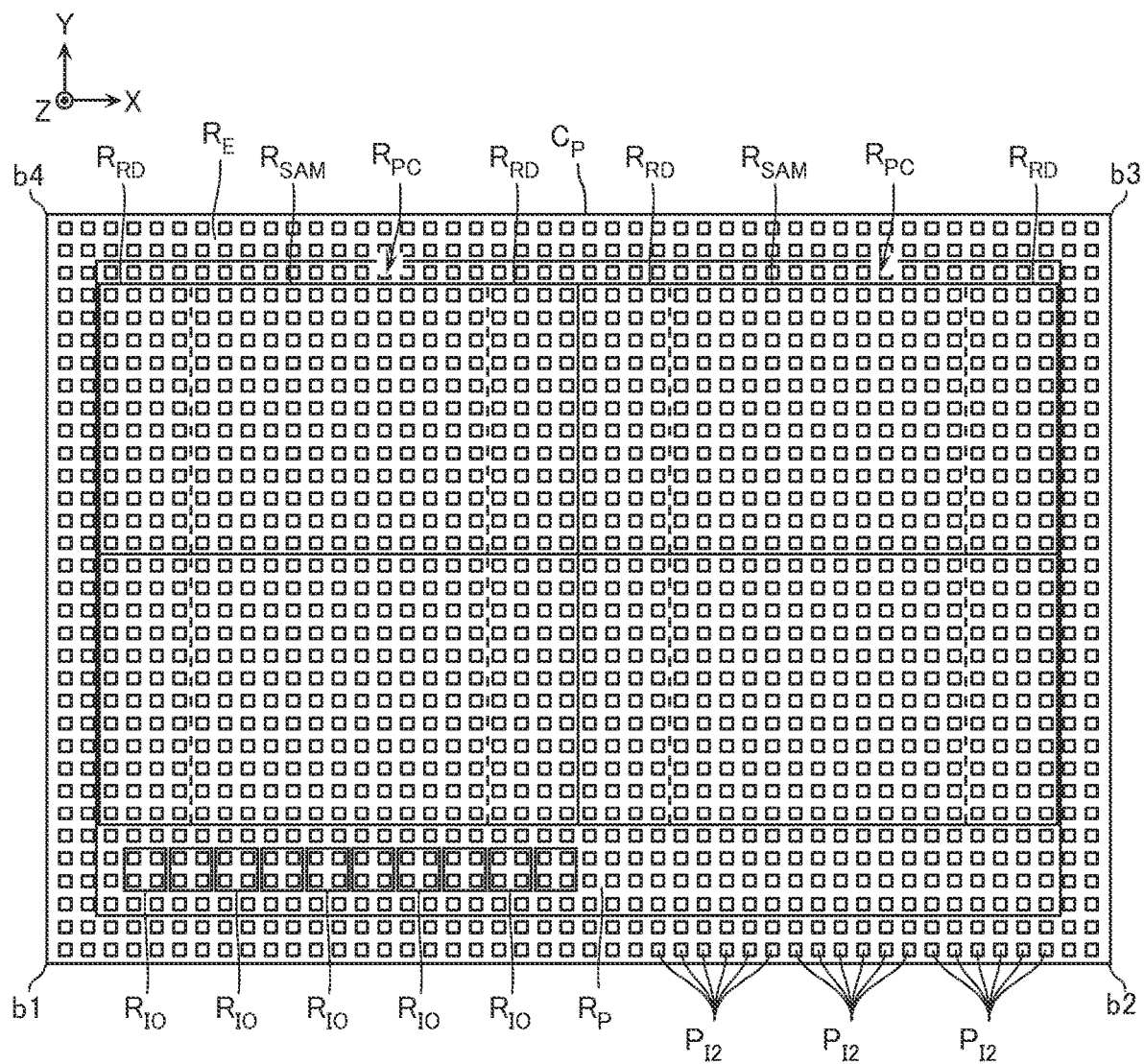
FIG. 7 is a schematic plan view illustrating an exemplary configuration of a chip $C_P$.
Figure 8:
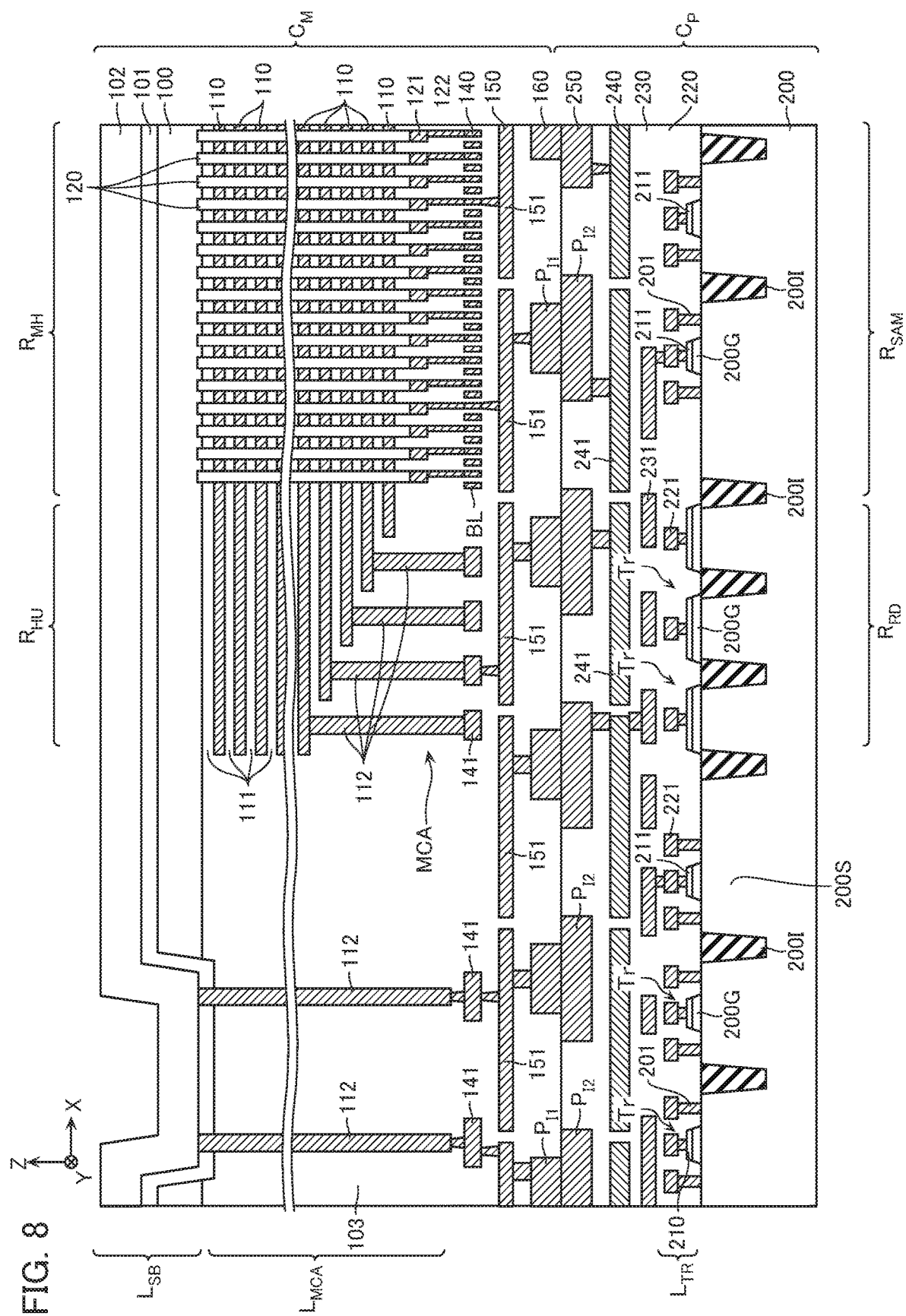
FIG. 8 is a schematic cross-sectional view corresponding to the line A-A' of FIG. 6.
Figure 9:
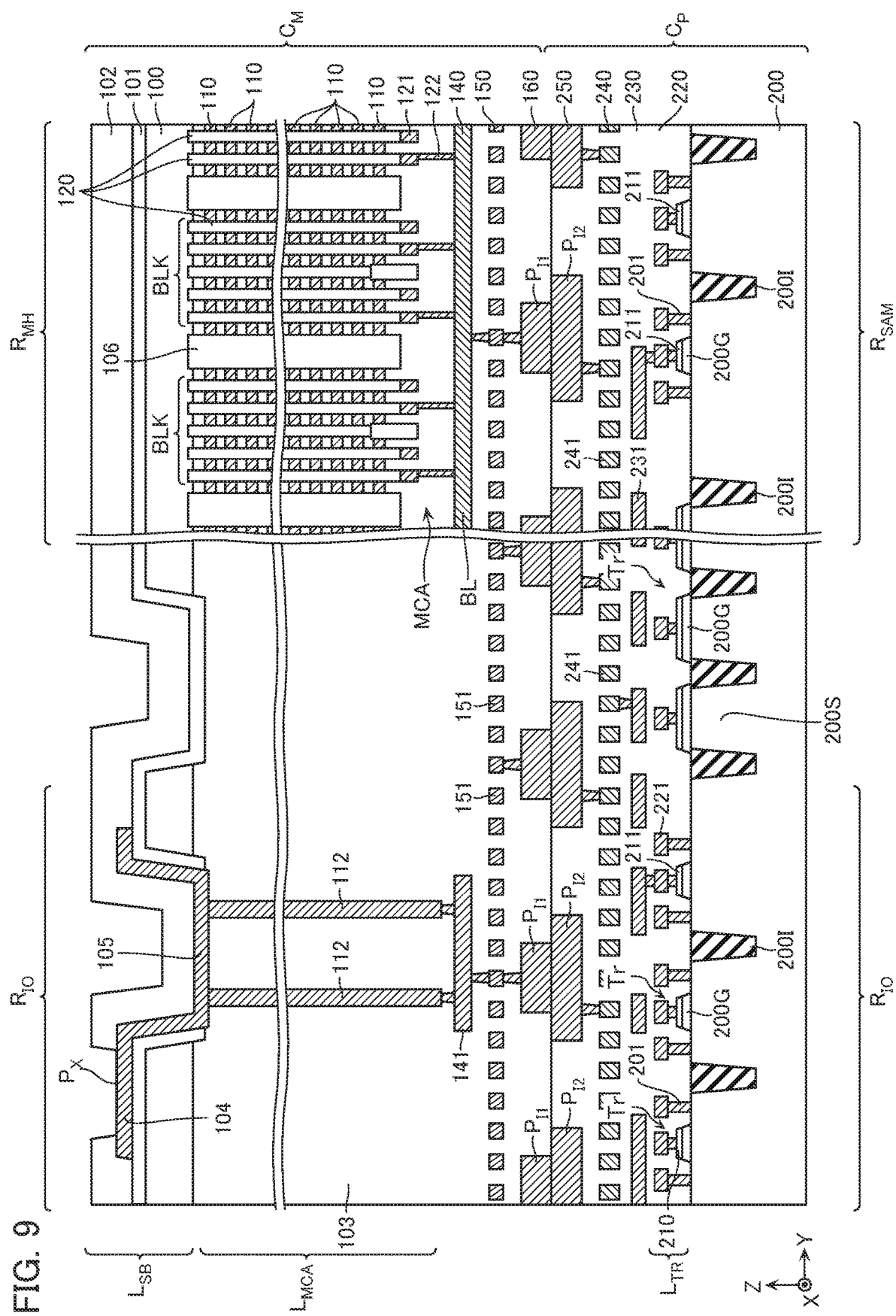
FIG. 9 is a schematic cross-sectional view corresponding to the line B-B' of FIG. 6.
Figure 10:
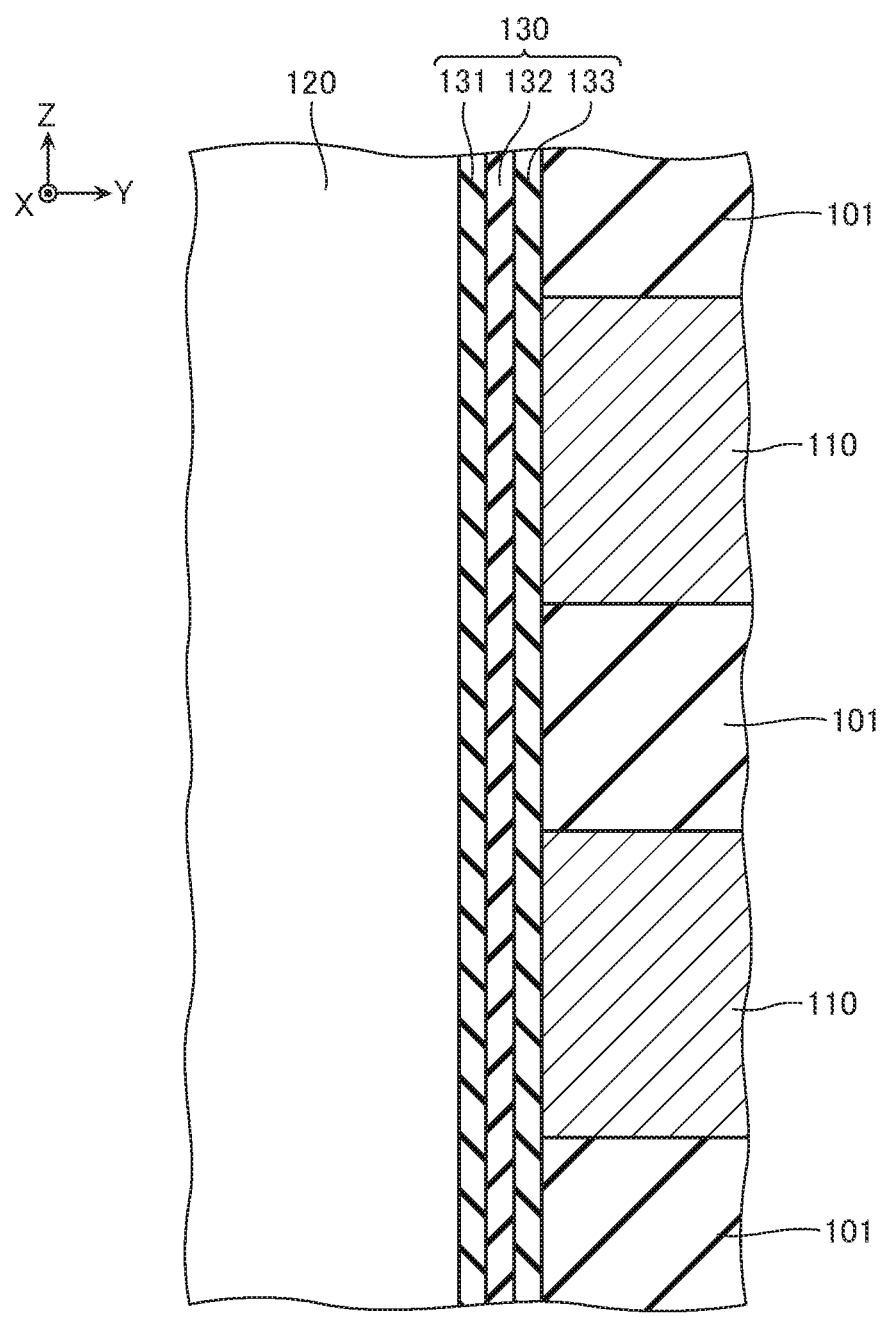
FIG. 10 is a schematic enlarged view of the configuration of a part of FIG. 9.
Figure 11:
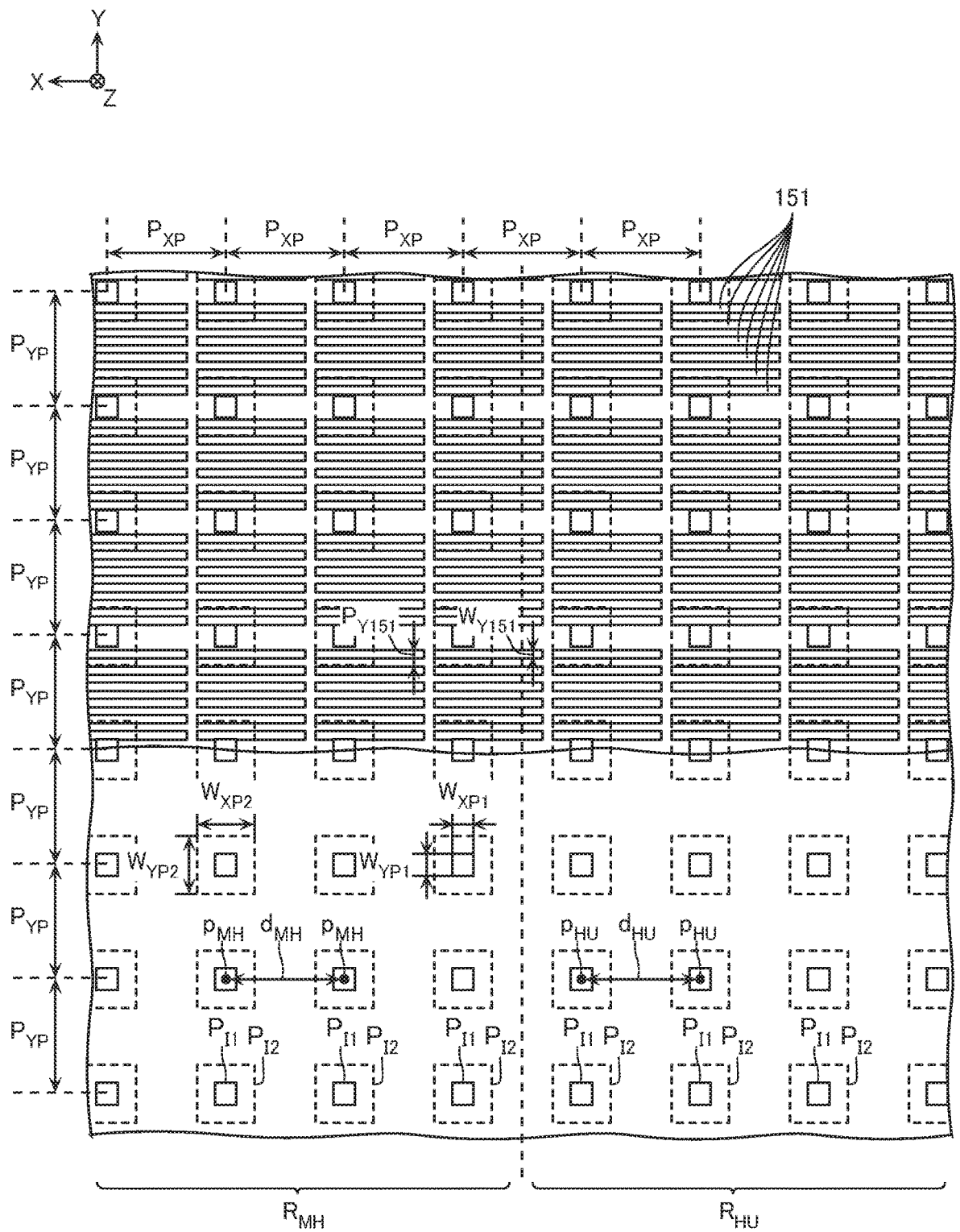
FIG. 11 is a schematic enlarged view of the configuration of a part of FIG. 5.
Figure 12:
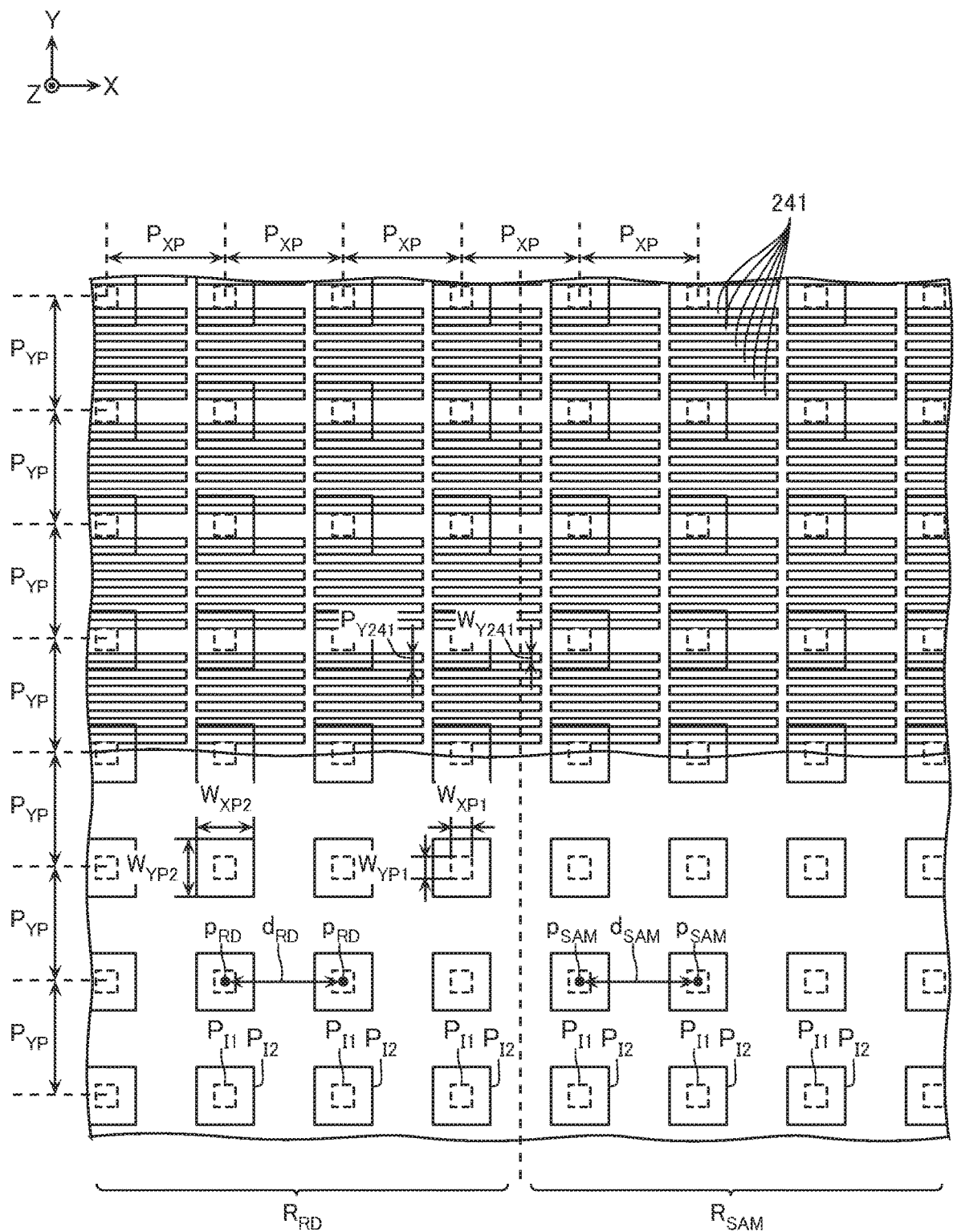
FIG. 12 is a schematic enlarged view of the configuration of a part of FIG. 7.

FIG. 5 is a schematic bottom view illustrating an exemplary configuration of the chip $C_M$. FIG. 6 is a schematic bottom view illustrating an exemplary configuration of the chip $C_M$ and illustrates a structure inside the front surface of the chip $C_M$ where the plurality of bonding electrodes $P_{I1}$ are disposed. FIG. 7 is a schematic plan view illustrating an exemplary configuration of the chip $C_P$. FIG. 8 is a schematic cross-sectional view corresponding to the line A-A' of FIG. 6. FIG. 9 is a schematic cross-sectional view corresponding to the line B-B' of FIG. 6. FIG. 10 is a schematic enlarged view of the configuration of a part of FIG. 9. FIG. 11 is a schematic enlarged view of the configuration of a part of FIG. 5. FIG. 12 is a schematic enlarged view of the configuration of a part of FIG. 7.

FIG. 11 illustrates the plurality of bonding electrodes $P_{I1}$. FIG. 11 also illustrates the bonding electrodes $P_{I2}$ bonded to these plurality of bonding electrodes $P_{I1}$ by the dotted lines. In a part of a region in FIG. 11, wirings 151 described later are illustrated.

FIG. 12 illustrates the plurality of bonding electrodes $P_{I2}$. FIG. 12 illustrates the bonding electrodes $P_{I1}$ bonded to these plurality of bonding electrodes $P_{I2}$ by the dotted lines. In a part of a region in FIG. 12, wirings 241 described later are illustrated.

[Structure of Chip $C_M$]

For example, as illustrated in FIG. 6, the chip $C_M$ includes four memory cell array regions $R_{MCA}$ arranged in the X and Y-directions. The memory cell array region $R_{MCA}$ includes a memory hole region $R_{MH}$ on which memory cells are disposed and hook-up regions $R_{HU}$ disposed on one side (for example, the left side in FIG. 6) and on the other side (for example, the right side in FIG. 6) in the X-direction of the memory hole region $R_{MH}$. Additionally, the chip $C_M$ includes a peripheral region $R_P$ disposed on one side (for example, the lower side in FIG. 6) in the Y-direction of these four memory cell array regions $R_{MCA}$. The peripheral region $R_P$ includes a plurality of input/output circuit regions $R_{IO}$ arranged in the X-direction. Edge regions $R_E$ are disposed on four sides of the chip $C_M$.

Note that in the example illustrated in the drawing, the hook-up regions $R_{HU}$ are disposed on one side and on the other side in the X-direction of the memory hole region $R_{MH}$. However, such a configuration is merely an example, and a specific configuration is appropriately adjustable. For example, the hook-up region $R_{HU}$ may be disposed at a center position or a position near the center in the X-direction of the memory cell array region $R_{MCA}$.

For example, as illustrated in FIG. 8 and FIG. 9, the chip $C_M$ includes a substrate layer $L_{SB}$, a memory cell array layer $L_{MCA}$ disposed below the substrate layer $L_{SB}$, and a plurality of wiring layers 140, 150, 160 disposed below the memory cell array layer $L_{MCA}$.

[Structure of Substrate Layer $L_{SB}$ in Chip $C_M$]

For example, as illustrated in FIG. 8, the substrate layer $L_{SB}$ includes a semiconductor layer 100, an insulating layer 101 disposed on the upper surface of the semiconductor layer 100, and an insulating layer 102 disposed on the upper surface of the insulating layer 101. Additionally, for example, as illustrated in FIG. 9, the input/output circuit region $R_{IO}$ includes bonding pad electrodes $P_X$ disposed between the insulating layer 101 and the insulating layer 102.

The semiconductor layer 100, for example, is a semiconductor layer, such as silicon (Si), into which N-type impurities, such as phosphorus (P), and P-type impurities, such as boron (B), are implanted. Between the semiconductor layer 100 and the insulating layer 101, for example, metal, such as tungsten (W), or silicide, such as tungsten silicide (WSi), may be disposed. The semiconductor layers 100 are disposed in a plurality of regions separated from one another in the X-direction or the Y-direction. For example, the semiconductor layers 100 are disposed in the respective four regions corresponding to the four memory cell array regions $R_{MCA}$ described with reference to FIG. 6.

The insulating layer 101, for example, is an insulating layer made of an insulating material, such as silicon oxide ($SiO_2$). For example, as illustrated in FIG. 8 and FIG. 9, the insulating layer 101 covers the upper surface and the side surface of the semiconductor layer 100 and the upper surface of an insulating layer 103, such as silicon oxide ($SiO_2$), included in the memory cell array layer $L_{MCA}$ over the entire surface.

The insulating layer 102, for example, is a passivation layer made of an insulating material, such as polyimide.

The bonding pad electrode $P_X$, for example, contains a conductive material, such as aluminum (Al). For example, as illustrated in FIG. 9, the bonding pad electrode $P_X$ includes an external connection region 104 disposed on the upper surface of the semiconductor layer 100 via the insulating layer 101 and an internal connection region 105 disposed on the upper surface of the insulating layer 103 included in the memory cell array layer $L_{MCA}$.

The external connection region 104 is a region connected to the bonding wire B (FIG. 2, FIG. 3). In the insulating layer 102, an opening is provided in at least a part of a portion corresponding to the external connection region 104. The external connection region 104 is exposed to a region outside the memory die MD via this opening.

The internal connection region 105 is a region connected to contacts 112 included in the memory cell array layer $L_{MCA}$. Note that the internal connection region 105 is disposed below the external connection region 104.

[Structure of Memory Cell Array Layer $L_{MCA}$ in Chip $C_M$]

For example, as illustrated in FIG. 9, the memory cell array MCA is disposed in the memory cell array region $R_{MCA}$ of the memory cell array layer $L_{MCA}$. The memory cell array MCA includes a plurality of memory blocks BLK arranged in the Y-direction and respective inter-block insulating layers 106, such as silicon oxide ($SiO_2$), disposed between these plurality of memory blocks BLK.

A portion of the memory block BLK included in the memory hole region $R_{MH}$ includes a plurality of conductive layers 110 arranged in the Z-direction, a plurality of semiconductor layers 120 extending in the Z-direction, and a respective plurality of gate insulating films 130 (FIG. 10) disposed between the plurality of conductive layers 110 and the plurality of semiconductor layers 120.

For example, as illustrated in FIG. 8, the conductive layer 110 is an approximately plate-shaped conductive layer extending in the X-direction. The conductive layer 110 may include, for example, a stacked film of a barrier conductive film, such as titanium nitride (TiN), and a metal film, such as tungsten (W). The conductive layer 110, for example, may contain polycrystalline silicon containing impurities, such as phosphorus (P) or boron (B). Between the plurality of conductive layers 110 arranged in the Z-direction, insulating layers 111, such as silicon oxide ($SiO_2$), are disposed. These plurality of conductive layers 110, for example, function as word lines and gate electrodes of a plurality of memory cells connected to them.

The semiconductor layers 120, for example, function as channel regions of a plurality of memory cells. The semiconductor layer 120 is, for example, a semiconductor layer, such as polycrystalline silicon (Si). The semiconductor layer 120, for example, has an approximately columnar shape. The outer peripheral surface of each of the semiconductor layers 120 is surrounded by the conductive layers 110 and is opposed to the conductive layers 110.

On the lower end portion of the semiconductor layer 120, an unillustrated impurity region containing N-type impurities, such as phosphorus (P), is disposed. This impurity region is connected to a bit line BL via a contact 121 and a contact 122.

On an upper end portion of the semiconductor layer 120, an unillustrated impurity region containing N-type impurities, such as phosphorus (P), or P-type impurities, such as boron (B), is disposed. This impurity region is connected to the semiconductor layer 100.

The gate insulating film 130 (FIG. 10) has an approximately closed-bottomed cylindrical shape covering the outer peripheral surface of the semiconductor layer 120. The gate insulating film 130 includes a tunnel insulating film 131, an electric charge accumulating film 132, and a block insulating film 133 stacked between the semiconductor layer 120 and the conductive layers 110. The tunnel insulating film 131 and the block insulating film 133 are, for example, insulating films, such as silicon oxide ($SiO_2$). The electric charge accumulating film 132 is, for example, a film that can accumulate an electric charge, such as silicon nitride ($Si_3N_4$). The tunnel insulating film 131, the electric charge accumulating film 132, and the block insulating film 133 have an approximately cylindrical shape and extend in the Z-direction along the outer peripheral surface of the semiconductor layer 120.

Note that FIG. 10 illustrates an example of the gate insulating film 130 including the electric charge accumulating film 132, such as silicon nitride. However, the gate insulating film 130, for example, may include a floating gate, such as polycrystalline silicon, containing N-type or P-type impurities.

For example, as illustrated in FIG. 8, a portion of the memory block BLK included in the hook-up region $R_{HU}$ includes the end portions in the X-direction of the plurality of conductive layers 110 arranged in the Z-direction and the plurality of contacts 112 extending in the Z-direction.

The conductive layers 110 form an approximately staircase pattern structure in the hook-up region $R_{HU}$. That is, the lower the conductive layer 110 is disposed, the closer the position in the X-direction of the end portion to the memory hole region $R_{MH}$ is, and the upper the conductive layer 110 is disposed, the farther the position in the X-direction of the end portion from the memory hole region $R_{MH}$.

The contact 112 may include, for example, a stacked film of a barrier conductive film, such as titanium nitride (TiN), and a metal film, such as tungsten (W). The contact 112, for example, has an approximately columnar shape. The respective plurality of contacts 112 have upper ends connected to the different conductive layers 110. Additionally, the respective plurality of contacts 112 have lower ends connected to different wirings 141.

For example, as illustrated in FIG. 9, the input/output circuit region $R_{IO}$ in the memory cell array layer $L_{MCA}$ includes the plurality of contacts 112 extending in the Z-direction. As described above, each of the upper ends of these plurality of contacts 112 is connected to the lower surface of the internal connection region 105 of the bonding pad electrode $P_X$. The respective plurality of contacts 112 have lower ends connected to the wirings 141.

[Structure of Wiring Layers 140, 150, 160 in Chip $C_M$]

The wiring layer 140 includes the plurality of wirings 141. These plurality of wirings 141 may include, for example, a stacked film of a barrier conductive film, such as titanium nitride (TiN), and a metal film, such as copper (Cu). A part of the plurality of wirings 141 functions as the bit lines BL. For example, the bit lines BL are arranged in the X-direction as illustrated in FIG. 8 and extend in the Y-direction as illustrated in FIG. 9. Additionally, these respective plurality of bit lines BL are connected to the plurality of semiconductor layers 120.

The wiring layer 150 includes the plurality of wirings 151. These plurality of wirings 151 may include, for example, a stacked film of a barrier conductive film, such as titanium nitride (TiN), and a metal film, such as copper (Cu).

The wiring layer 160 includes the plurality of bonding electrodes $P_{I1}$. These plurality of bonding electrodes $P_{I1}$ may include, for example, a stacked film of a barrier conductive film, such as titanium nitride (TiN), and a metal film, such as copper (Cu).

Here, as illustrated in FIG. 11, the plurality of bonding electrodes $P_{I1}$ are arranged in a matrix in the X-direction and the Y-direction across the entire surface (the lower surface) of the chip $C_M$. Additionally, in the example of FIG. 11, the bonding electrodes $P_{I1}$ are arranged in the X-direction at an arrangement period $P_{XP}$ and arranged in the Y-direction at an arrangement period $P_{YP}$. Additionally, in the example of FIG. 11, a width in the X-direction of the bonding electrode $P_{I1}$ is a width $W_{XP1}$ and a width in the Y-direction of the bonding electrode $P_{I1}$ is a width $W_{YP1}$. While FIG. 11 illustrates the bonding electrodes $P_{I1}$ disposed in the memory hole region $R_{MH}$ and the hook-up region $R_{HU}$ as an example, as illustrated in FIG. 5 as an example, the plurality of bonding electrodes $P_{I1}$ are disposed in the regions other than these (the peripheral region $R_P$ and the edge region $R_E$) in the similar aspect.

Note that variations in the arrangement period $P_{XP}$ in the X-direction and the arrangement period $P_{YP}$ in the Y-direction of the bonding electrodes $P_{I1}$, and the width $W_{XP1}$ in the X-direction and the width $W_{YP1}$ in the Y-direction of the bonding electrodes $P_{I1}$, for example, may fall within the range from 90% to 110% with respect to the respective average values.

For example, FIG. 11 illustrates the center position (the barycentric position on the image) on the XY plane of the bonding electrode $P_{I1}$ disposed in the memory hole region $R_{MH}$ as a point $p_{MH}$. Additionally, FIG. 11 illustrates a distance between the two points $p_{MH}$ corresponding to the two bonding electrodes $P_{I1}$ adjacent in the X-direction as a distance $d_{MH}$. For example, FIG. 11 illustrates the center position (the barycentric position on the image) on the XY plane of the bonding electrode $P_{I1}$ disposed in the hook-up region $R_{HU}$ as a point $p_{HU}$. Additionally, FIG. 11 illustrates a distance between the two points $p_{HU}$ corresponding to the two bonding electrodes $P_{I1}$ adjacent in the X-direction as a distance $d_{HU}$. Here, the distance $d_{MH}$ and the distance $d_{HU}$, for example, may be matched in the range from 90% to 110%.

This relationship may be satisfied not only between the two bonding electrodes $P_{I1}$ adjacent in the X-direction but also between the two bonding electrodes $P_{I1}$ adjacent in the Y-direction. Additionally, this relationship may be satisfied not only between the bonding electrodes $P_{I1}$ disposed in the memory hole region $R_{MH}$ and the bonding electrodes $P_{I1}$ disposed in the hook-up region $R_{HU}$ but also between these bonding electrodes $P_{I1}$ and the bonding electrodes $P_{I1}$ disposed in the peripheral region $R_P$ and the edge region $R_E$.

As illustrated FIG. 11, all of the plurality of wirings 151 extend in the X-direction across the entire surface (the lower surface) of the chip $C_M$. Note that FIG. 11 omits a part of the wirings 151. In the example of FIG. 11, the wirings 151 are arranged in the Y-direction at an arrangement period $P_{Y151}$. The arrangement period $P_{Y151}$ in the Y-direction of the wirings 151 is 1/n (n is an integer of one or more) of the arrangement period $P_{YP}$ in the Y-direction of the bonding electrodes $P_{I1}$. In the example of FIG. 11, the width in the Y-direction of the wiring 151 is a width $W_{Y151}$. While FIG. 11 illustrates the wirings 151 disposed in the memory hole region $R_{MH}$ and the hook-up region $R_{HU}$ as an example, the plurality of wirings 151 are disposed in the regions other than these (the peripheral region $R_P$ and edge region $R_E$) in the similar aspect.

Note that variations in the arrangement period $P_{Y151}$ in the Y-direction of the wirings 151 and the width $W_{Y151}$ in the Y-direction of the wiring 151, for example, may fall within the range from 90% to 110% with respect to the respective average values.

At least a part of the plurality of bonding electrodes $P_{I1}$ and the plurality of wirings 151 disposed in the memory hole region $R_{MH}$ are connected to the bit lines BL (FIG. 8) via the contacts 121, 122.

At least a part of the plurality of bonding electrodes $P_{I1}$ and the plurality of wirings 151 disposed in the hook-up region $R_{HU}$ are connected to the conductive layers 110 (FIG. 8) via the contacts 112.

Additionally, at least a part of the plurality of bonding electrodes $P_{I1}$ and the plurality of wirings 151 disposed in the input/output circuit region $R_{IO}$ are connected to the bonding pad electrodes $P_X$ (FIG. 9) via the contacts 112.

[Structure of Chip $C_P$]

For example, as illustrated in FIG. 7, the chip $C_P$ includes four circuit regions $R_{PC}$ disposed at positions corresponding to the four memory cell array regions $R_{MCA}$ (FIG. 6). The circuit region $R_{PC}$ includes sense amplifier module regions $R_{SAM}$ disposed at positions corresponding to a part of the memory hole regions $R_{MH}$ (FIG. 6) and row decoder regions $R_{RD}$ disposed at positions corresponding to the two hook-up regions $R_{HU}$. The chip $C_P$ includes the peripheral region $R_P$ disposed corresponding to the peripheral region $R_P$ (FIG. 6) of the chip $C_M$ and the edge region $R_E$ disposed corresponding to the edge region $R_E$ of the chip $C_M$.

For example, as illustrated in FIG. 8 and FIG. 9, the chip $C_P$ includes a semiconductor substrate 200, a transistor layer $L_{TR}$ disposed above the semiconductor substrate 200, and a plurality of wiring layers 220, 230, 240, 250 disposed above the transistor layer $L_{TR}$.

[Structure of Semiconductor Substrate 200 in Chip $C_P$]

The semiconductor substrate 200 is, for example, a semiconductor substrate made of P-type silicon (Si) containing P-type impurities, such as boron (B). On the surface of the semiconductor substrate 200, a semiconductor substrate region 200S and insulating regions 200I are disposed.

[Structure of Transistor Layer $L_{TR}$ in Chip $C_P$]

On the upper surface of the semiconductor substrate 200, electrode layers 210 are disposed via insulating layers 200G. The electrode layer 210 includes a plurality of electrodes 211 opposed to the surface of the semiconductor substrate 200. The plurality of electrodes 211 included in the respective regions of the semiconductor substrate 200 and the electrode layers 210 are connected to contacts 201.

The semiconductor substrate region 200S of the semiconductor substrate 200 functions as a channel region of a plurality of transistors Tr and the like constituting the peripheral circuit.

The respective plurality of electrodes 211 included in the electrode layers 210 function as gate electrodes of the plurality of transistors Tr and the like constituting the peripheral circuit. The electrode 211, for example, includes a semiconductor layer, such as polycrystalline silicon (Si) containing N-type impurities, such as phosphorus (P), and P-type impurities, such as boron (B), and a metal layer, such as tungsten (W), disposed on the upper surface of this semiconductor layer.

The contact 201 extends in the Z-direction and has a lower end connected to the semiconductor substrate 200 or an upper surface of the electrode 211. The contact 201 may include, for example, a stacked film of a barrier conductive film, such as titanium nitride (TiN), and a metal film, such as tungsten (W).

Note that each of the plurality of transistors Tr disposed on the semiconductor substrate 200 constitutes a part of the peripheral circuit.

For example, the plurality of transistors Tr disposed in the row decoder region $R_{RD}$ (FIG. 7) constitute a part of a row decoder that selectively transfers voltage to any of the plurality of conductive layers 110. A part of the plurality of transistors Tr constituting the row decoder functions as word line switches connected to the conductive layers 110 without via the other transistors Tr.

For example, the plurality of transistors Tr disposed in the sense amplifier module region $R_{SAM}$ (FIG. 7) constitute a part of a sense amplifier module that measures the voltage or the current of the plurality of bit lines BL and selectively transfers the voltage to any of the plurality of bit lines BL. A part of the plurality of transistors Tr constituting the sense amplifier module functions as bit line switches connected to the bit lines BL without via the other transistors Tr.

For example, the plurality of transistors Tr disposed in the input/output circuit region $R_{IO}$ (FIG. 7) function as input/output circuits that input and output user data, command data, or address data via a part of the plurality of bonding pad electrodes $P_X$. A part of the plurality of transistors Tr constituting the input/output circuit functions as a part of a pull-up circuit, a part of a pull-down circuit, or a part of a comparator connected to the bonding pad electrodes $P_X$ without via the other transistors Tr.

[Structures of Wiring Layers 220, 230, 240, 250 in Chip $C_P$]

The plurality of wirings included in the wiring layers 220, 230, 240, 250, for example, are electrically connected to at least one of the configuration in the transistor layer $L_{TR}$ and the configuration in the chip $C_M$.

The wiring layer 220 includes a plurality of wirings 221. These plurality of wirings 221 may include, for example, a stacked film of a barrier conductive film, such as titanium nitride (TiN), and a metal film, such as copper (Cu).

The wiring layer 230 includes a plurality of wirings 231. These plurality of wirings 231 may include, for example, a stacked film of a barrier conductive film, such as titanium nitride (TiN), and a metal film, such as copper (Cu).

The wiring layer 240 includes the plurality of wirings 241. These plurality of wirings 241 may include, for example, a stacked film of a barrier conductive film, such as titanium nitride (TiN), and a metal film, such as copper (Cu).

The wiring layer 250 includes the plurality of bonding electrodes $P_{I2}$. These plurality of bonding electrodes $P_{I2}$ may include, for example, a stacked film of a barrier conductive film, such as titanium nitride (TiN), and a metal film, such as copper (Cu).

Here, as illustrated in FIG. 12, the plurality of bonding electrodes $P_{I2}$ are arranged in a matrix in the X-direction and the Y-direction across the entire surface (the upper surface) of the chip $C_P$. Additionally, in the example of FIG. 12, the bonding electrodes $P_{I2}$ are arranged in the X-direction at an arrangement period $P_{XP}$ and arranged in the Y-direction at an arrangement period $P_{YP}$. Additionally, in the example of FIG. 12, a width in the X-direction of the bonding electrode $P_{I2}$ is a width $W_{XP2}$ and a width in the Y-direction of the bonding electrode $P_{I2}$ is a width $W_{YP2}$. The width $W_{XP2}$ in the X-direction of the bonding electrode $P_{I2}$ is greater than the width $W_{XP1}$ in the X-direction of the bonding electrode $P_{I1}$. Additionally, the width $W_{YP2}$ in the Y-direction of the bonding electrode $P_{I2}$ is greater than the width $W_{YP1}$ in the Y-direction of the bonding electrode $P_{I1}$. While FIG. 12 illustrates the bonding electrodes $P_{I2}$ disposed in the sense amplifier module region $R_{SAM}$ and the row decoder region $R_{RD}$ as an example, as illustrated in FIG. 5 as an example, the plurality of bonding electrodes $P_{I2}$ are disposed in the regions (the peripheral region $R_P$ and the edge region $R_E$) other than these in the similar aspect.

Note that variations in the width $W_{XP2}$ in the X-direction and the width $W_{YP2}$ in the Y-direction of the bonding electrodes $P_{I2}$, for example, may fall within the range from 90% to 110% with respect to the respective average values.

For example, FIG. 12 illustrates the center position (the barycentric position on the image) on the XY plane of the bonding electrode $P_{I2}$ disposed in the sense amplifier module region $R_{SAM}$ as a point $p_{SAM}$. Additionally, FIG. 12 illustrates a distance between the two points $p_{SAM}$ corresponding to the two bonding electrodes $P_{I2}$ adjacent in the X-direction as a distance $d_{SAM}$. For example, FIG. 12 illustrates the center position (the barycentric position on the image) on the XY plane of the bonding electrode $P_{I2}$ disposed in the row decoder region $R_{RD}$ as a point $p_{RD}$. Additionally, FIG. 12 illustrates a distance between the two points $p_{RD}$ corresponding to the two bonding electrodes $P_{I2}$ adjacent in the X-direction as a distance $d_{RD}$. Here, the distance $d_{SAM}$ and the distance $d_{RD}$, for example, may be matched in the range from 90% to 110%.

This relationship may be satisfied not only between the two bonding electrodes $P_{I2}$ adjacent in the X-direction but also between the two bonding electrodes $P_{I2}$ adjacent in the Y-direction. Additionally, this relationship may be satisfied not only between the bonding electrodes $P_{I2}$ disposed in the sense amplifier module region $R_{SAM}$ and the bonding electrodes $P_{I2}$ disposed in the row decoder region $R_{RD}$ but also between these bonding electrodes $P_{I2}$ and the bonding electrodes $P_{I2}$ disposed in the peripheral region $R_P$ and the edge region $R_E$.

As illustrated FIG. 12, all of the plurality of wirings 241 extend in the X-direction across the entire surface (the upper surface) of the chip $C_P$. Note that FIG. 12 omits a part of the wirings 241. In the example of FIG. 12, the wirings 241 are arranged in the Y-direction at an arrangement period $P_{Y241}$. The arrangement period $P_{Y241}$ in the Y-direction of the wirings 241 is 1/m (m is an integer of one or more) of the arrangement period $P_{YP}$ in the Y-direction of the bonding electrodes $P_{I2}$. In the example of FIG. 12, the width in the Y-direction of the wiring 241 is a width $W_{Y241}$. While FIG. 12 illustrates the wirings 241 disposed in the sense amplifier module region $R_{SAM}$ and the row decoder region $R_{RD}$ as an example, the plurality of wirings 241 are disposed in the regions (the peripheral region $R_P$ and edge region $R_E$) other than these in the similar aspect.

Note that variations in the arrangement period $P_{Y241}$ in the Y-direction of the wirings 241 and the width $W_{Y241}$ in the Y-direction of the wiring 241, for example, may fall within the range from 90% to 110% with respect to the respective average values.

At least a part of the plurality of bonding electrodes $P_{I2}$ disposed in the sense amplifier module region $R_{SAM}$ is connected to the transistors Tr constituting the sense amplifier module.

At least a part of the plurality of bonding electrodes $P_{I2}$ disposed in the row decoder region $R_{RD}$ is connected to the transistors Tr that function as the word line switches.

At least a part of the plurality of bonding electrodes $P_{I2}$ disposed in the input/output circuit region $R_{IO}$ is connected to the transistors Tr constituting the input/output circuit.

[Manufacturing Method of Memory Die MD]

Figure 13:
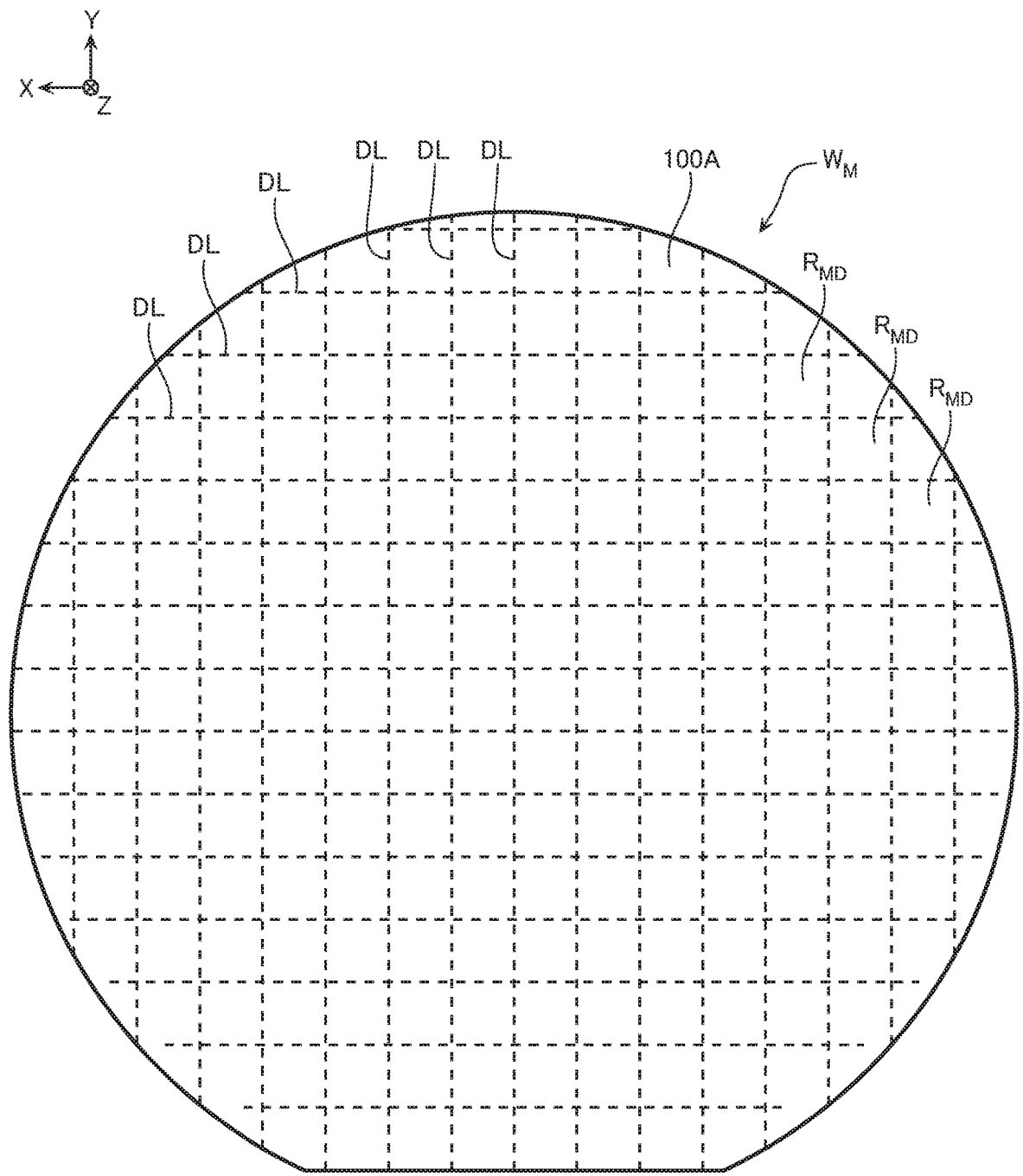
FIG. 13 is a schematic bottom view for describing a manufacturing method according to the first embodiment.

Next, with reference to FIG. 13 to FIG. 34, the manufacturing method of the memory die MD will be described. FIG. 13 is a schematic bottom view for describing the same manufacturing method. FIG. 14, FIG. 16 to FIG. 19, FIG. 21 to FIG. 24, FIG. 26 to FIG. 29, and FIG. 31 to FIG. 34 are schematic cross-sectional views for describing the same manufacturing method and illustrate the portion corresponding to FIG. 9. FIG. 15 and FIG. 20 are schematic bottom views for describing the same manufacturing method and illustrate the portion corresponding to FIG. 11. FIG. 25 and FIG. 30 are schematic bottom views for describing the same manufacturing method and illustrate the portion corresponding to FIG. 12.

FIG. 13 illustrates a wafer $W_M$ used for manufacturing the chips $C_M$ as an example. On semiconductor substrates 100A of the wafer $W_M$, a plurality of dicing lines DL extending in the X-direction or the Y-direction are provided. Each region partitioned by these plurality of dicing lines DL becomes the memory die region RMC.

Figure 14:
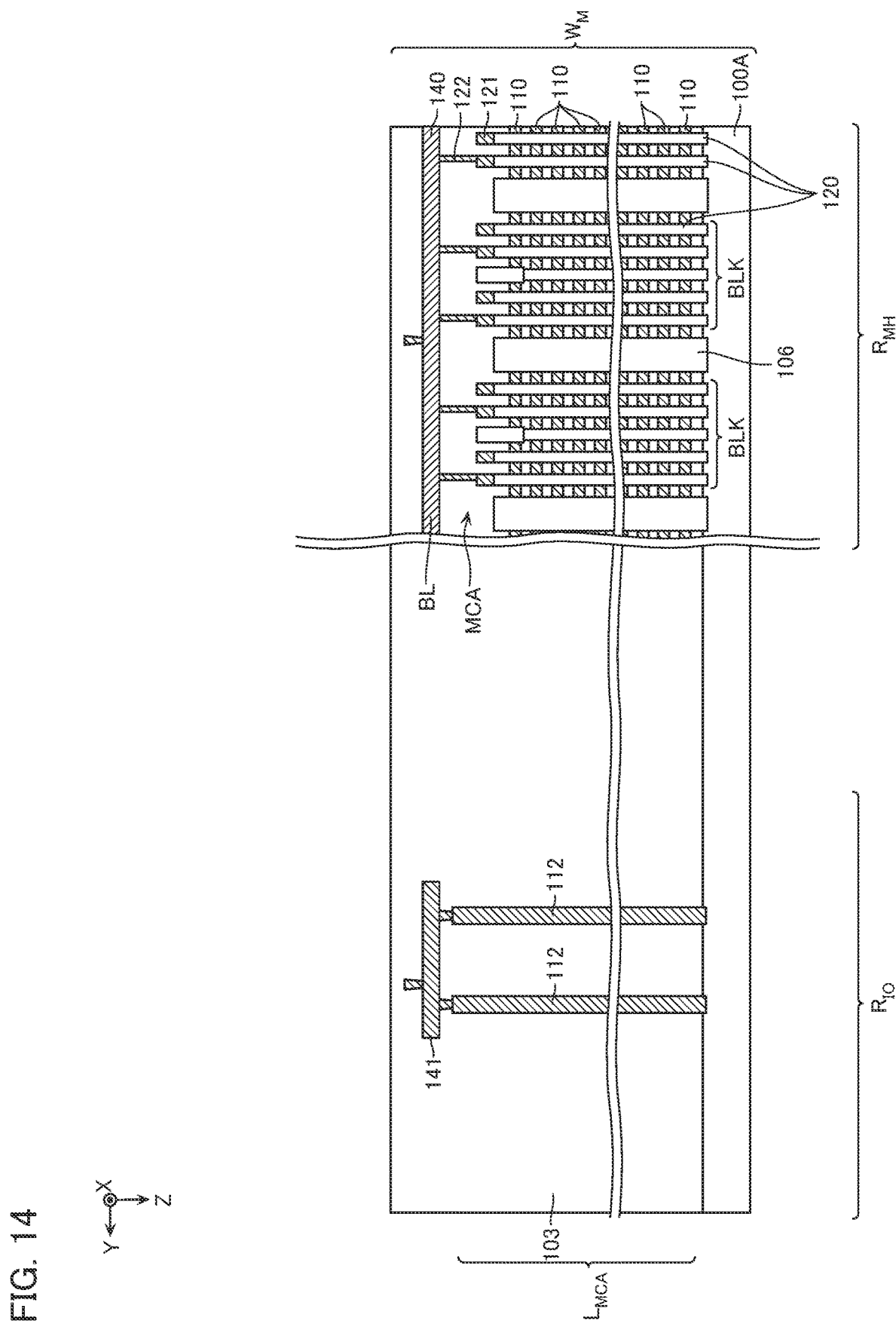
FIG. 14 is a schematic cross-sectional view for describing the same manufacturing method.
Figure 15:
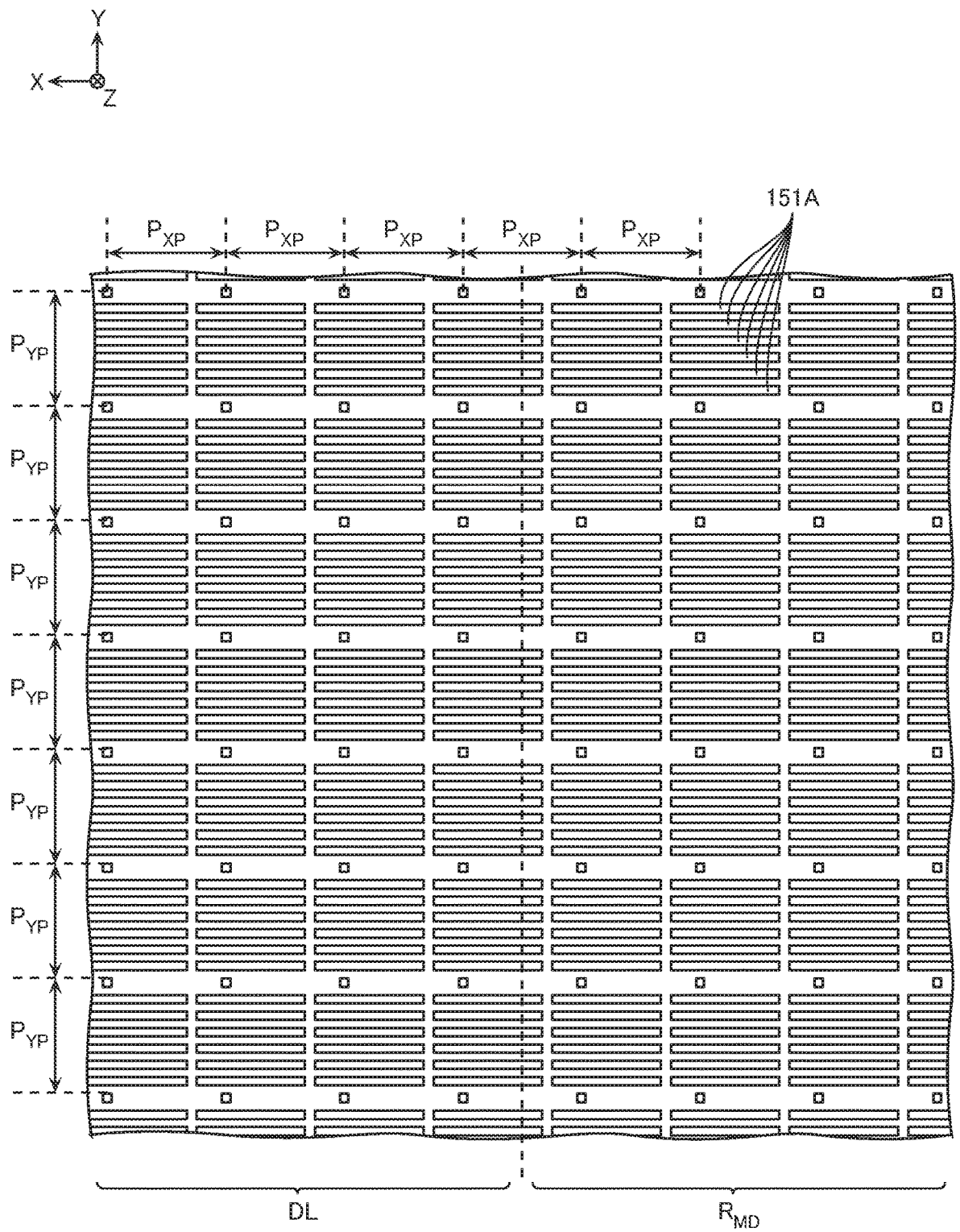
FIG. 15 is a schematic bottom view for describing the same manufacturing method.

In this manufacturing method, for example, as illustrated in FIG. 14, on the semiconductor substrate 100A, the memory cell array MCA, the contacts 112, and the wiring layer 140 are formed.

Figure 16:
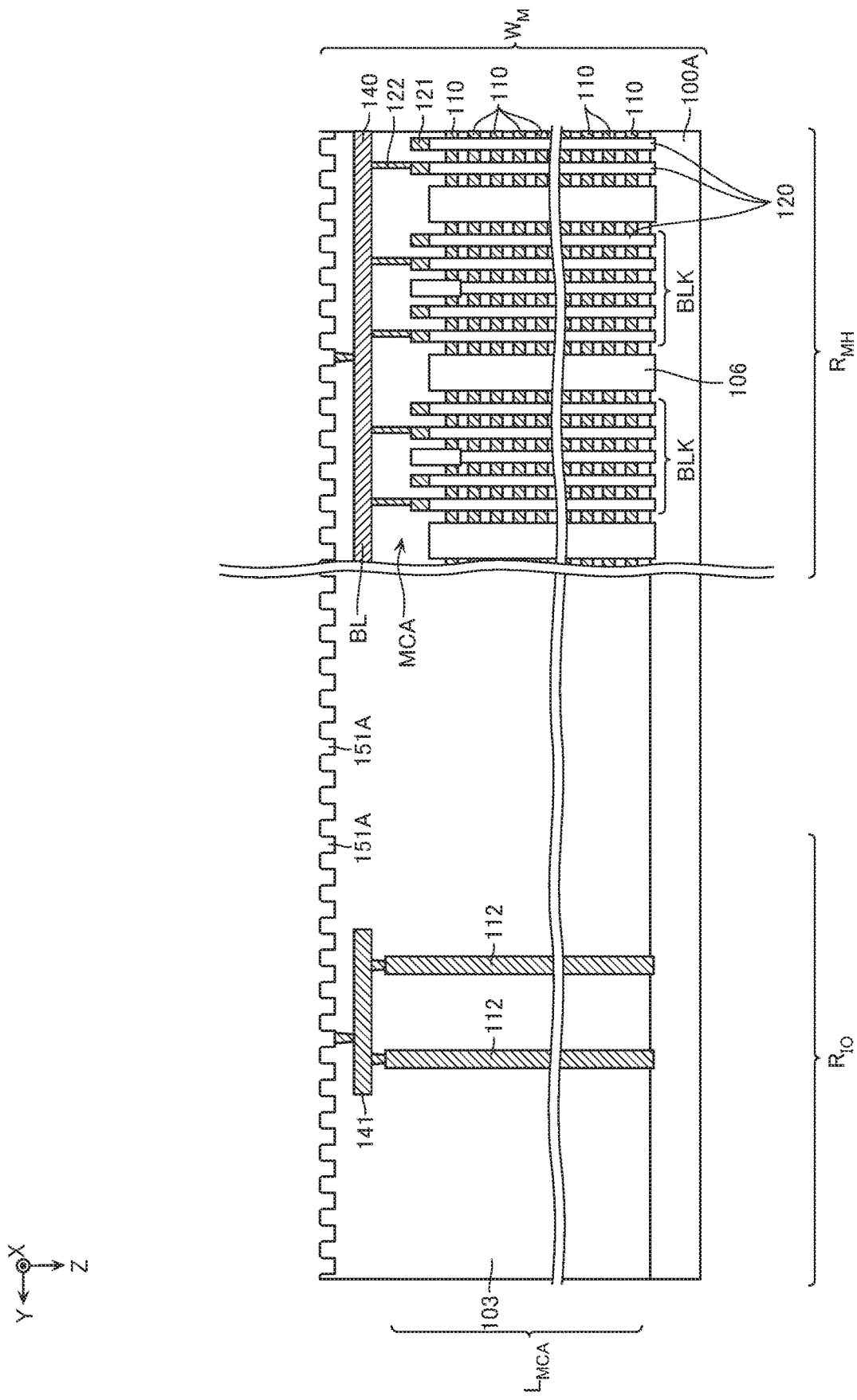
FIG. 16 is a schematic cross-sectional view for describing the same manufacturing method.

Next, for example, as illustrated in FIG. 15 and FIG. 16, trenches 151A are formed at the positions corresponding to the plurality of wirings 151 (FIG. 9). This process is performed by, for example, photolithography and etching. Note that as illustrated in FIG. 15, the trenches 151A are formed with a uniform placement density across the entire surface of the wafer $W_M$ including on the dicing lines DL.

Figure 17:
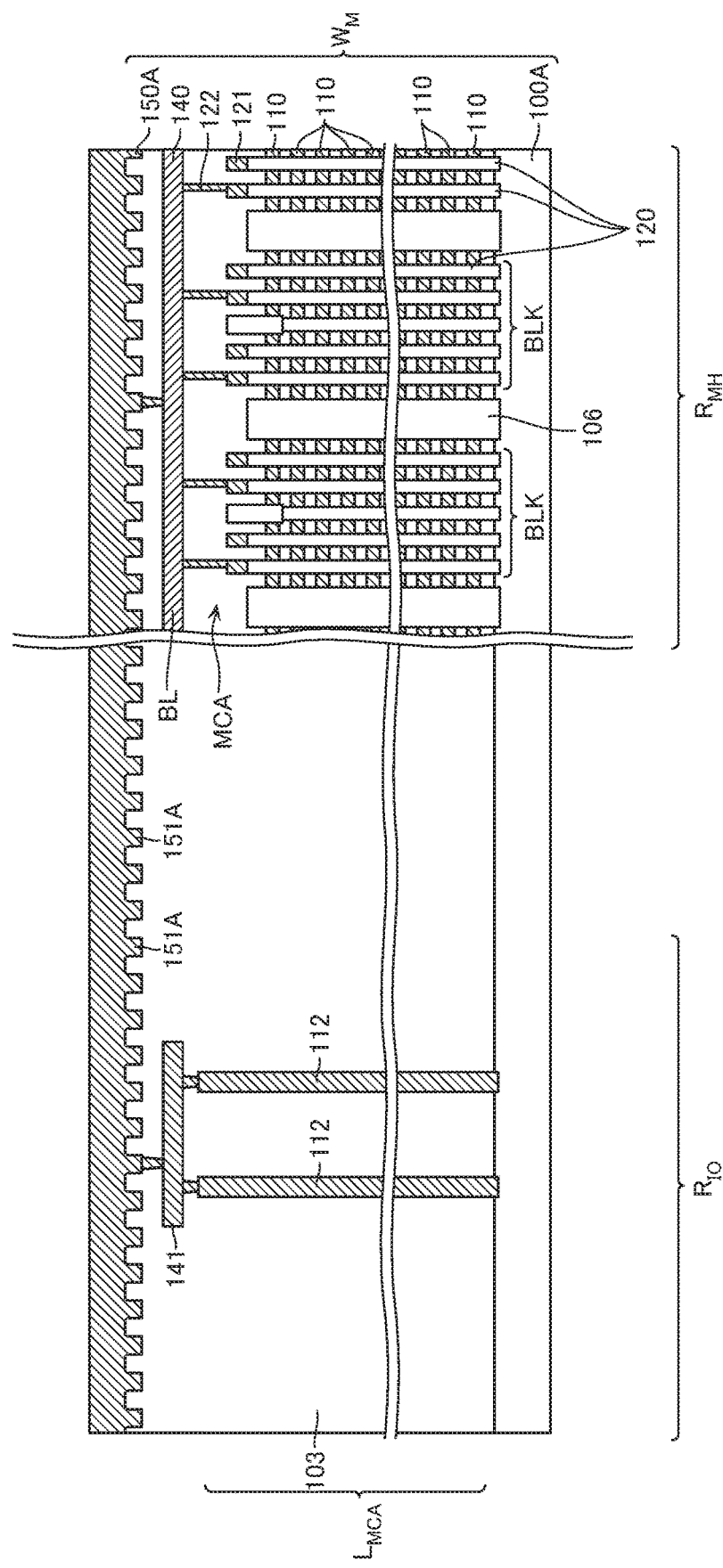
FIG. 17 is a schematic cross-sectional view for describing the same manufacturing method.

Next, for example, as illustrated in FIG. 17, a conductive layer 150A is formed on the surface of the wafer $W_M$. This process is performed by, for example, sputtering.

Figure 18:
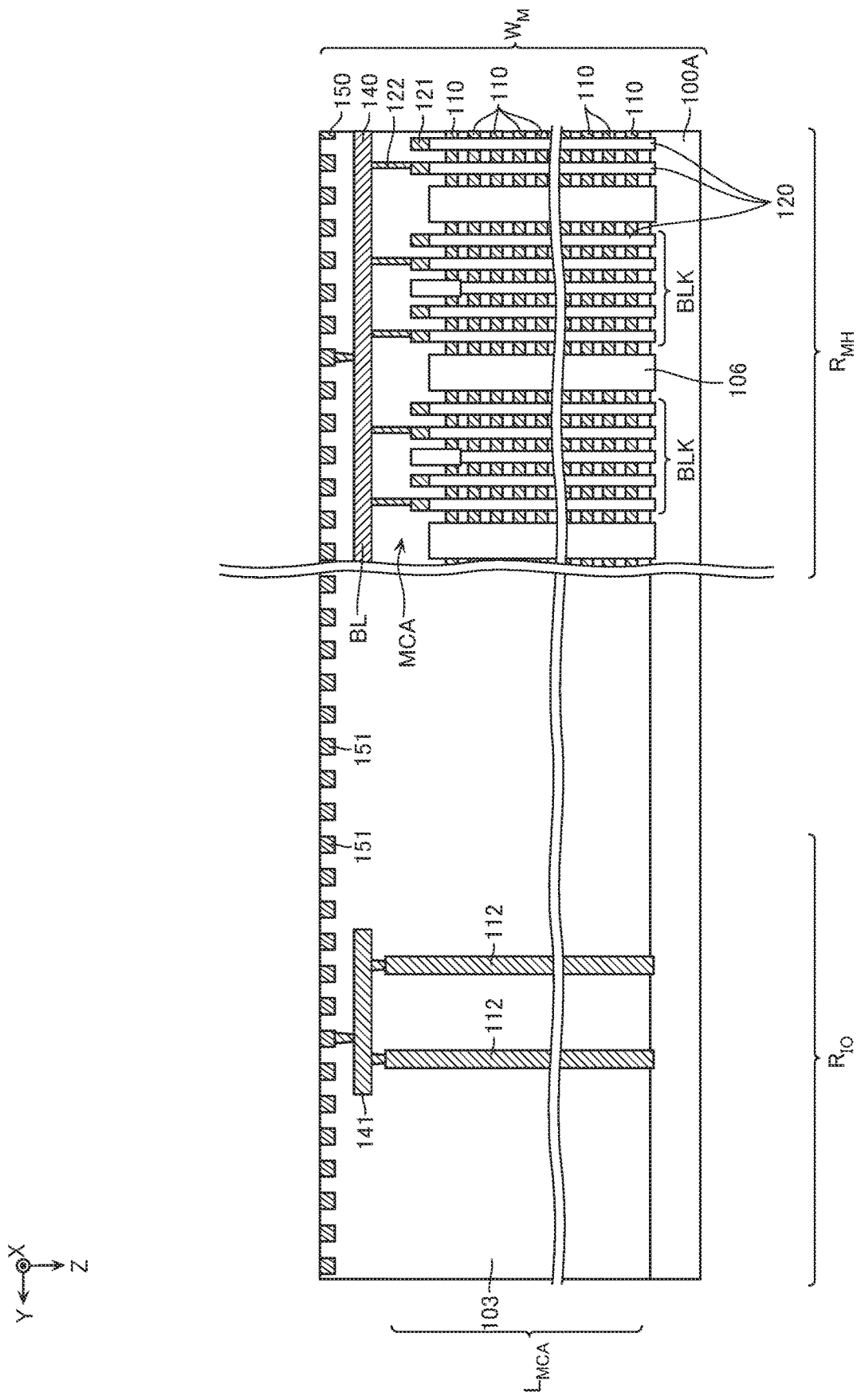
FIG. 18 is a schematic cross-sectional view for describing the same manufacturing method.

Next, for example, as illustrated in FIG. 18, the conductive layer 150A is removed with the portions formed inside the trenches 151A left. This process forms the plurality of wirings 151. This process is, for example, performed by Chemical Mechanical Polishing (CMP).

Figure 19:
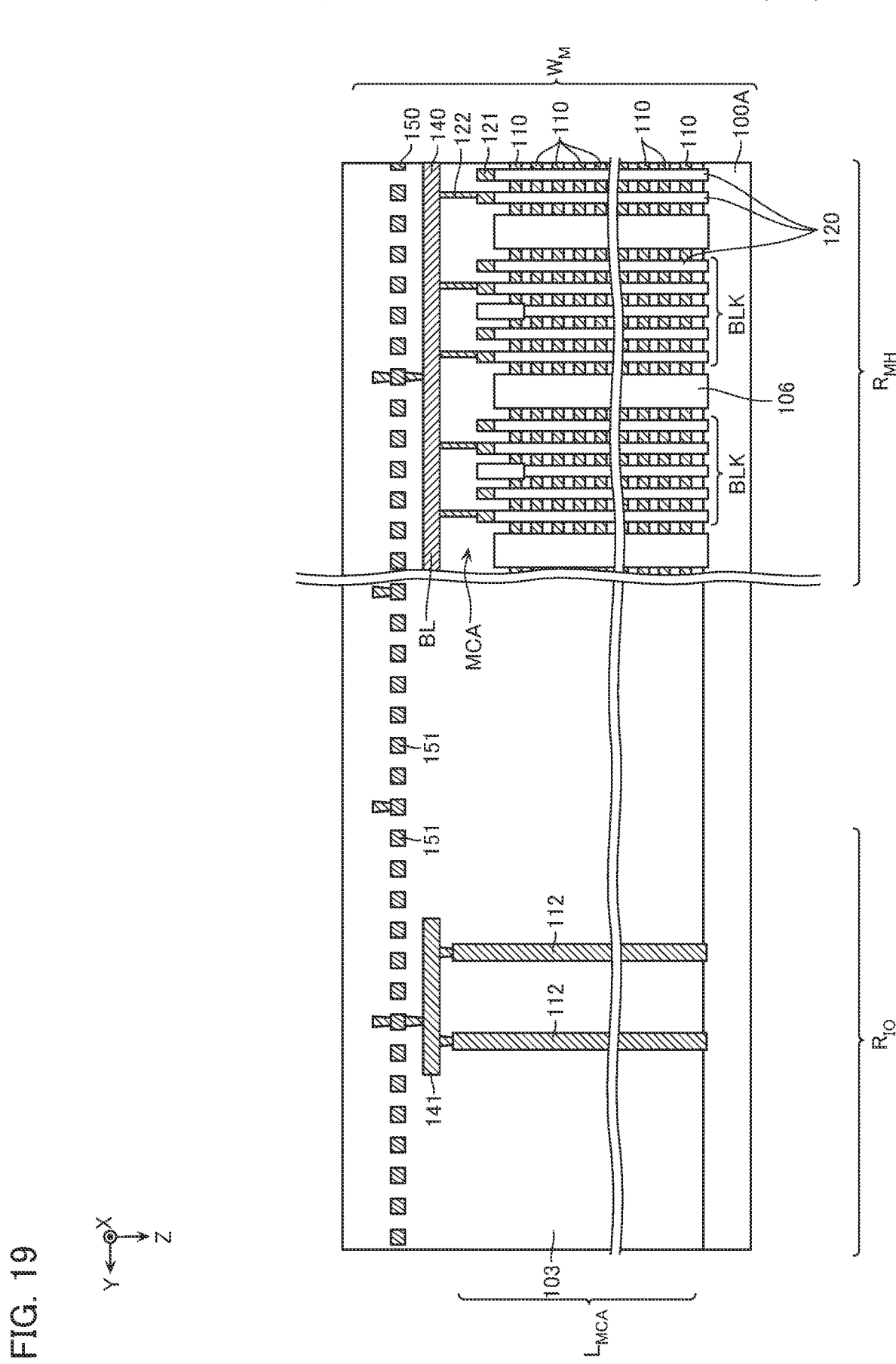
FIG. 19 is a schematic cross-sectional view for describing the same manufacturing method.
Figure 20:
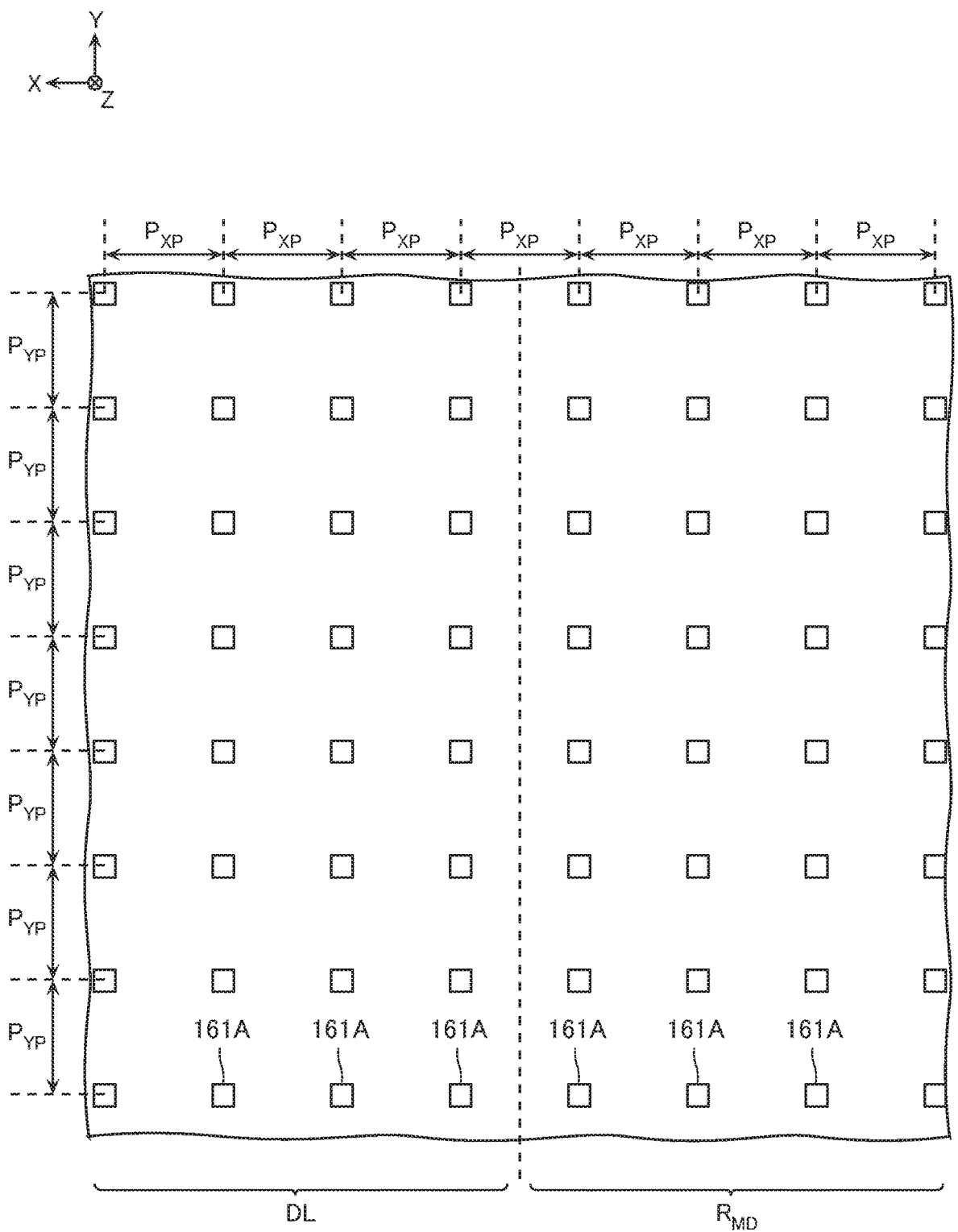
FIG. 20 is a schematic bottom view for describing the same manufacturing method.
Figure 21:
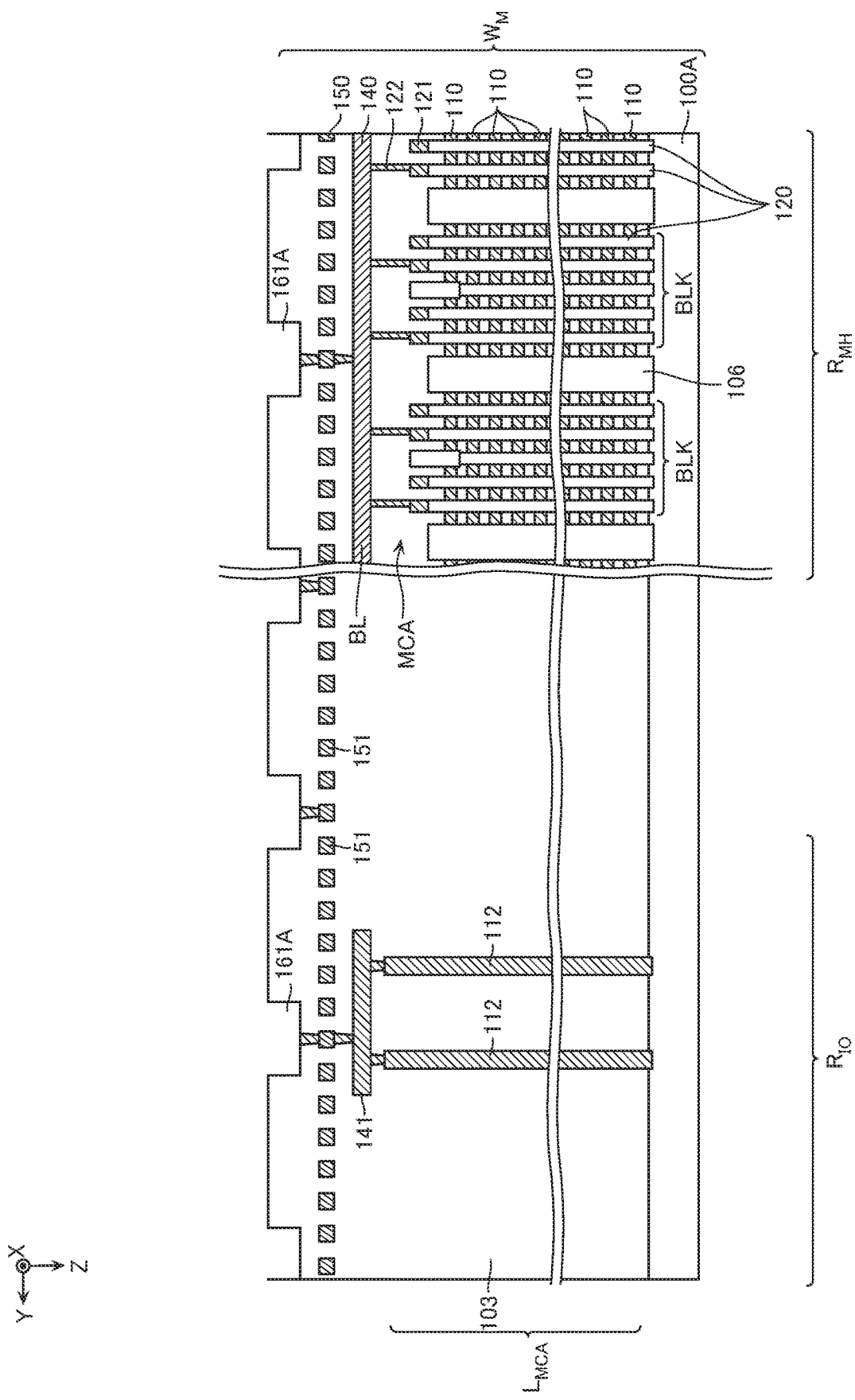
FIG. 21 is a schematic cross-sectional view for describing the same manufacturing method.

Next, for example, as illustrated in FIG. 19, an insulating layer and the like covering the surfaces of the plurality of wirings 151 are formed. This process is, for example, performed by Chemical Vapor Deposition (CVD). Next, for example, as illustrated in FIG. 20 and FIG. 21, trenches 161A are formed at positions corresponding to the plurality of bonding electrodes $P_{f1}$ (FIG. 9). This process is, for example, performed by photolithography and etching. Note that as illustrated in FIG. 20, the trenches 161A are formed with a uniform placement density across the entire surface of the wafer $W_M$ including on the dicing lines DL.

Figure 22:
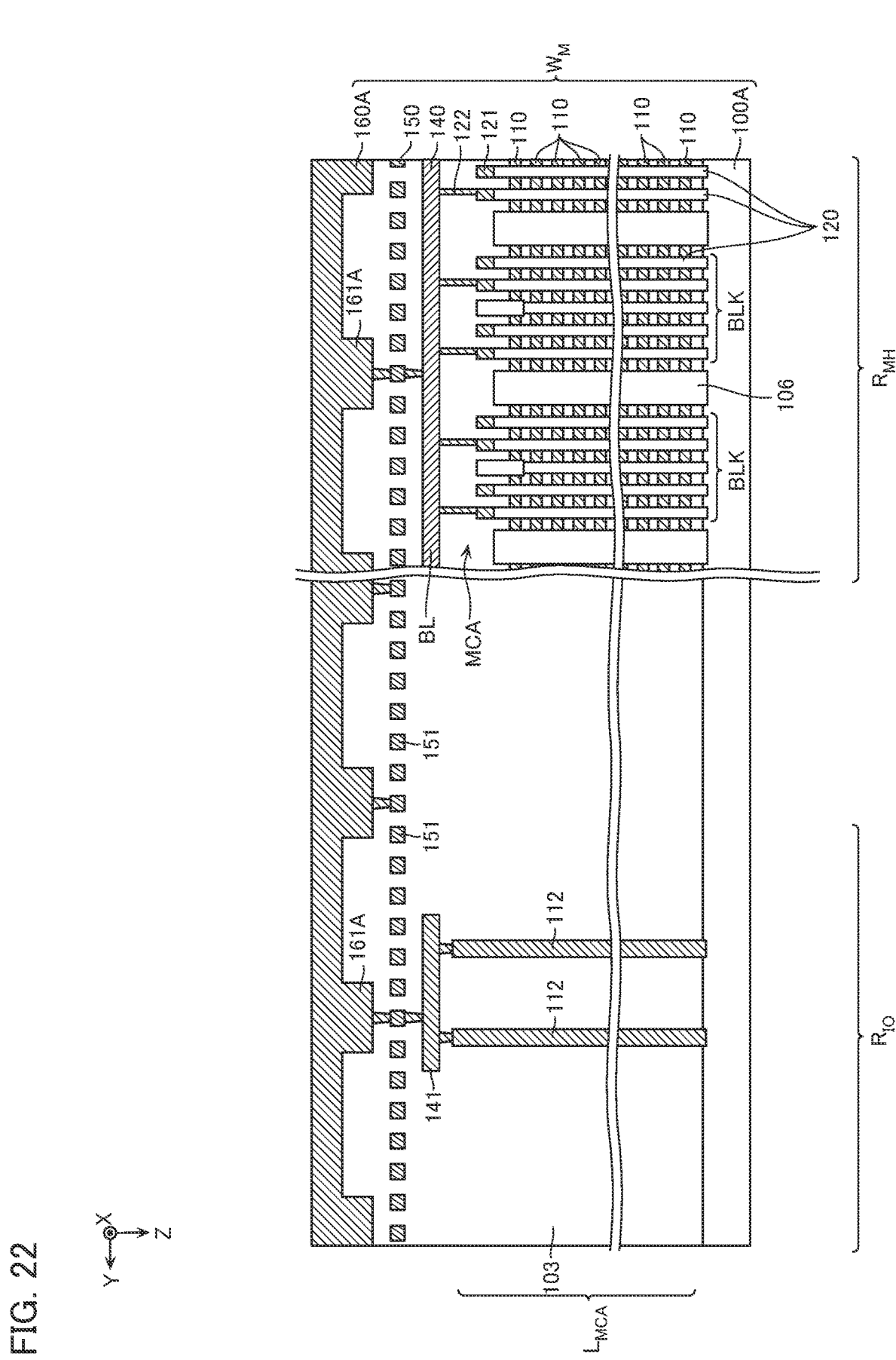
FIG. 22 is a schematic cross-sectional view for describing the same manufacturing method.

Next, for example, as illustrated in FIG. 22, a conductive layer 160A is formed on the surface of the wafer $W_M$. This process is performed by, for example, sputtering.

Figure 23:
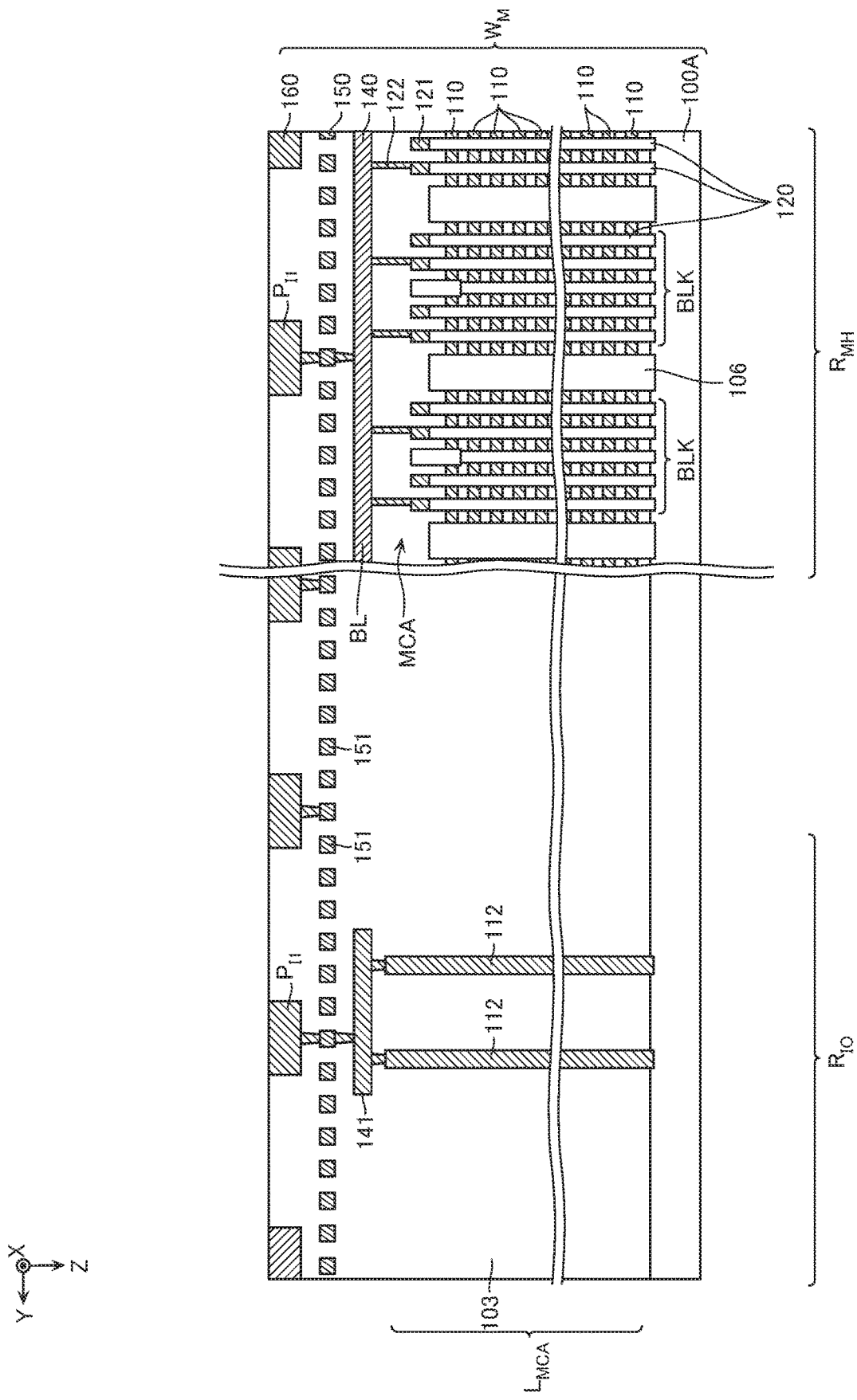
FIG. 23 is a schematic cross-sectional view for describing the same manufacturing method.

Next, for example, as illustrated in FIG. 23, the conductive layer 160A is removed with the portions formed inside the trenches 161A left. This process forms the plurality of bonding electrodes $P_{f1}$. This process is, for example, performed by CMP.

Figure 24:
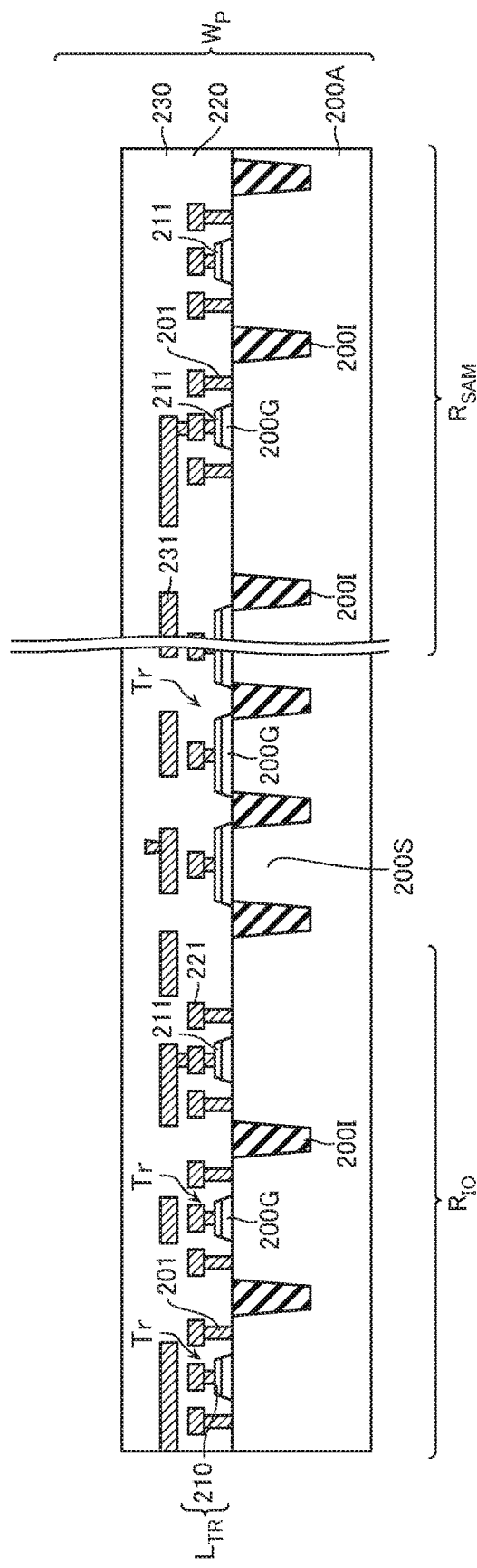
FIG. 24 is a schematic cross-sectional view for describing the same manufacturing method.
Figure 25:
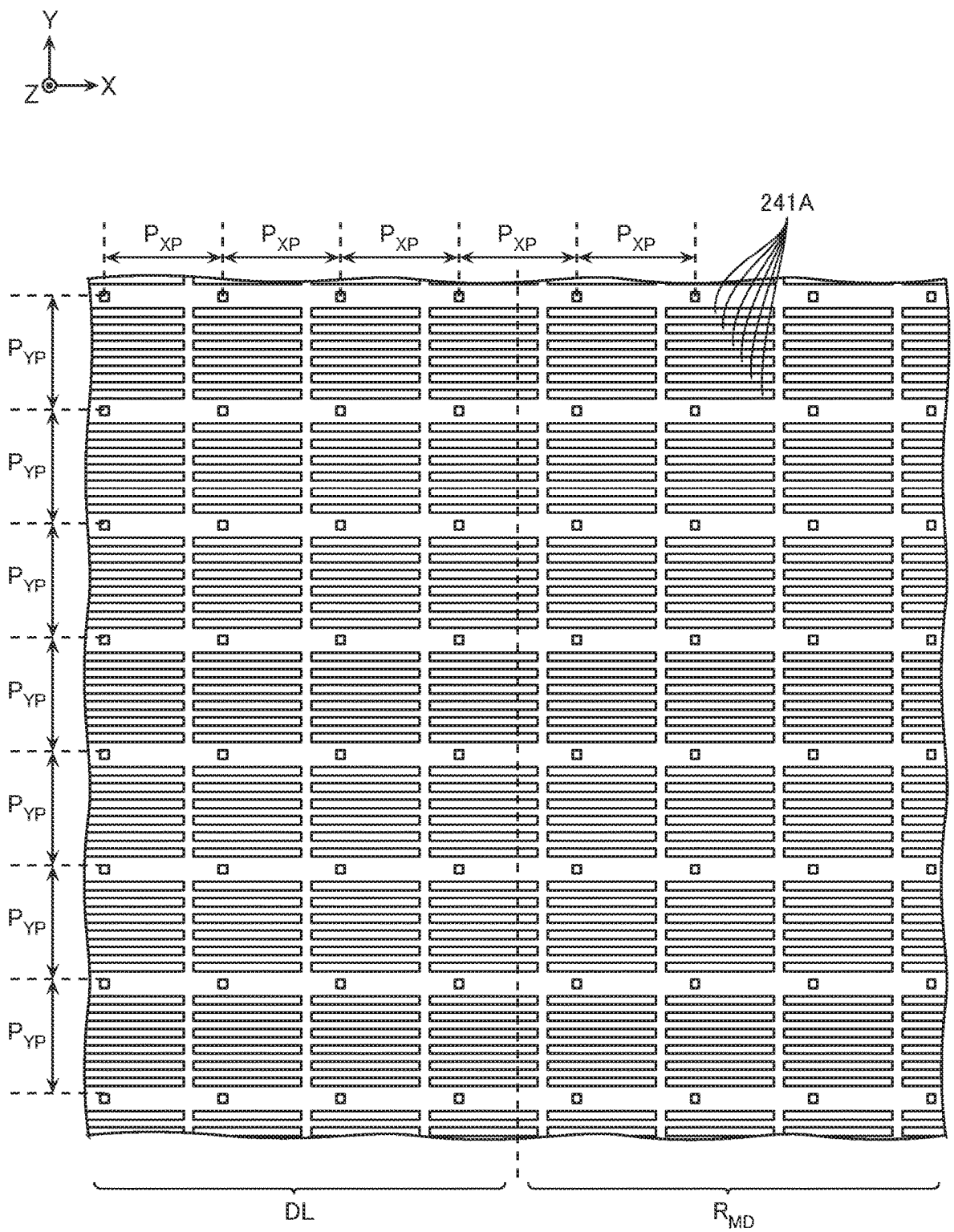
FIG. 25 is a schematic bottom view for describing the same manufacturing method.

FIG. 24 illustrates a wafer $W_P$ used for manufacturing the chips $C_P$ as an example.

In this manufacturing method, for example, as illustrated in FIG. 24, on a semiconductor substrate 200A, the transistor layer $L_{TR}$, the wiring layer 220, and the wiring layer 230 are formed.

Figure 26:
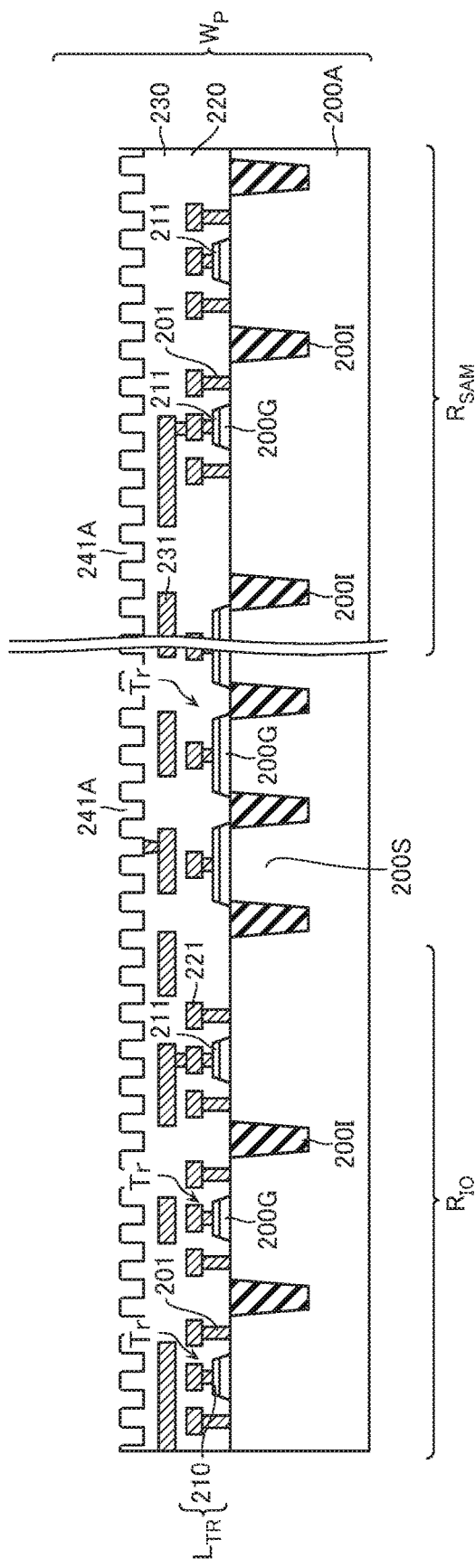
FIG. 26 is a schematic cross-sectional view for describing the same manufacturing method.

Next, for example, as illustrated in FIG. 25 and FIG. 26, trenches 241A are formed at positions corresponding to the plurality of wirings 241 (FIG. 9). This process is, for example, performed by photolithography and etching. Note that as illustrated in FIG. 25, the trenches 241A are formed with a uniform placement density across the entire surface of the wafer $W_P$ including on the dicing lines DL.

Figure 27:
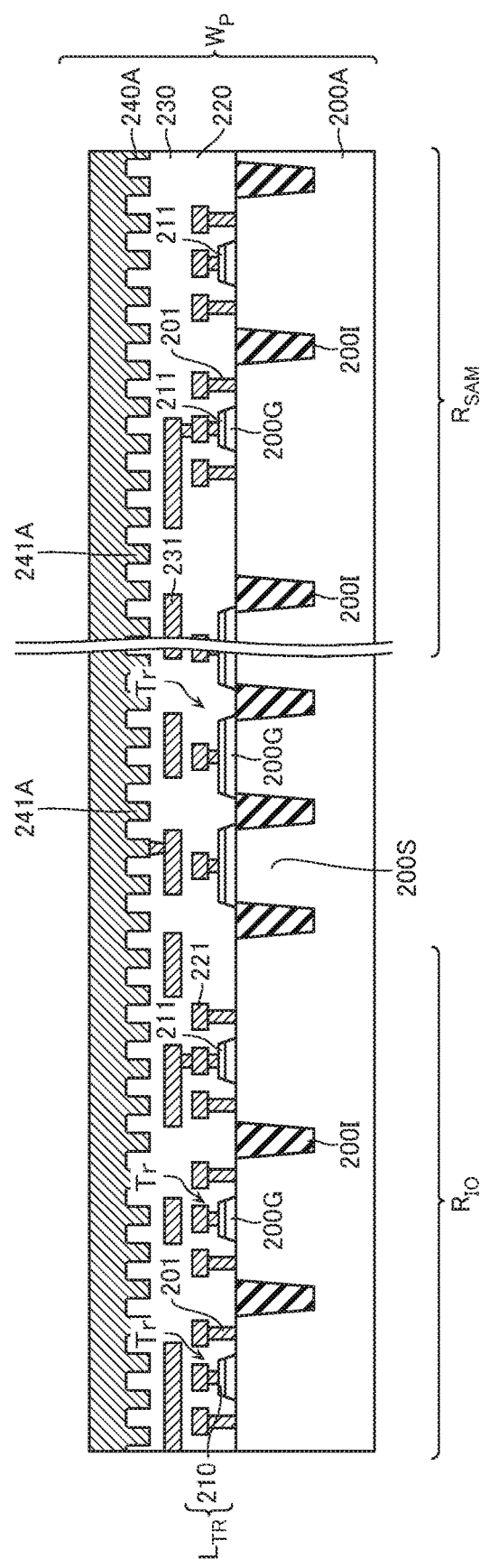
FIG. 27 is a schematic cross-sectional view for describing the same manufacturing method.

Next, for example, as illustrated in FIG. 27, a conductive layer 240A is formed on the surface of the wafer $W_P$. This process is performed by, for example, sputtering.

Figure 28:
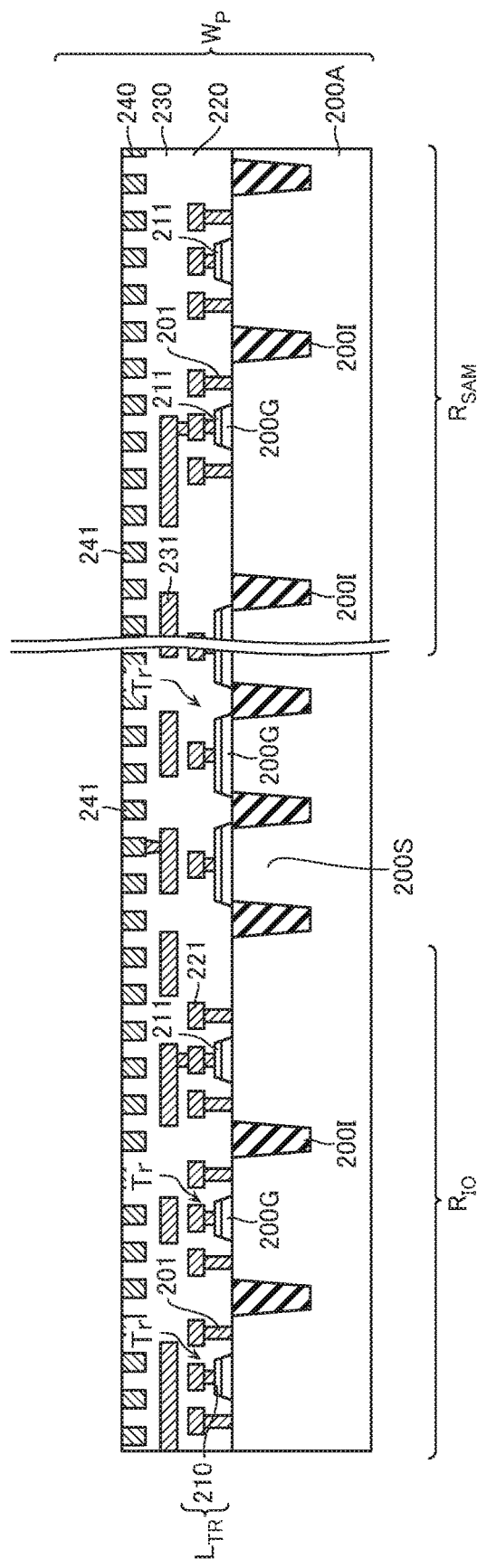
FIG. 28 is a schematic cross-sectional view for describing the same manufacturing method.

Next, for example, as illustrated in FIG. 28, the conductive layer 240A is removed with the portions formed inside the trenches 241A left. This process forms the plurality of wirings 241. This process is, for example, performed by CMP.

Figure 29:
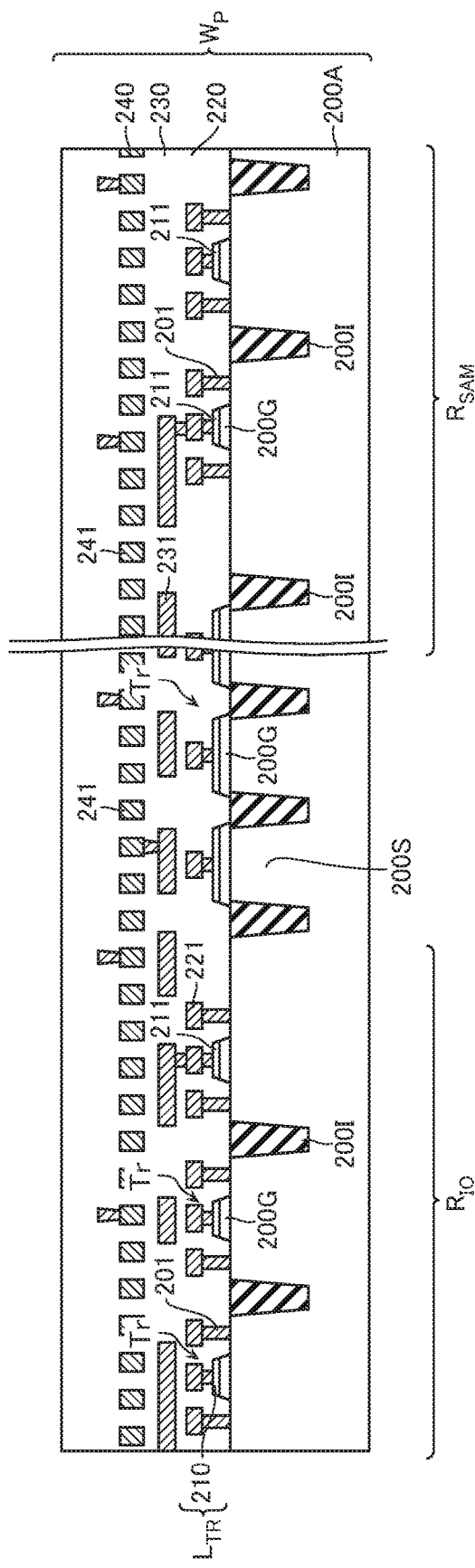
FIG. 29 is a schematic cross-sectional view for describing the same manufacturing method.
Figure 30:
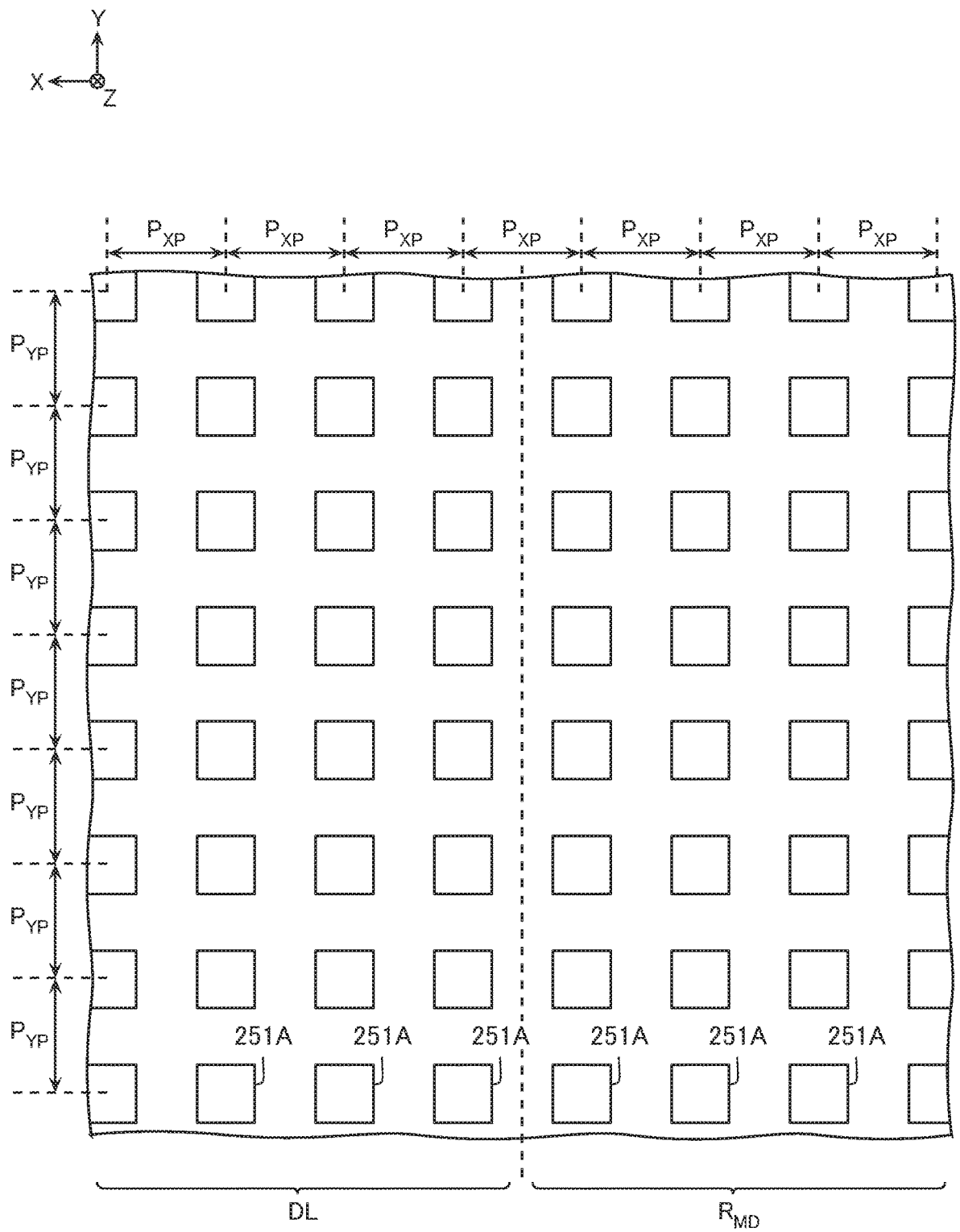
FIG. 30 is a schematic bottom view for describing the same manufacturing method.

Next, for example, as illustrated in FIG. 29, an insulating layer and the like covering the surfaces of the plurality of wirings 241 are formed. This process is, for example, performed by CVD.

Figure 31:
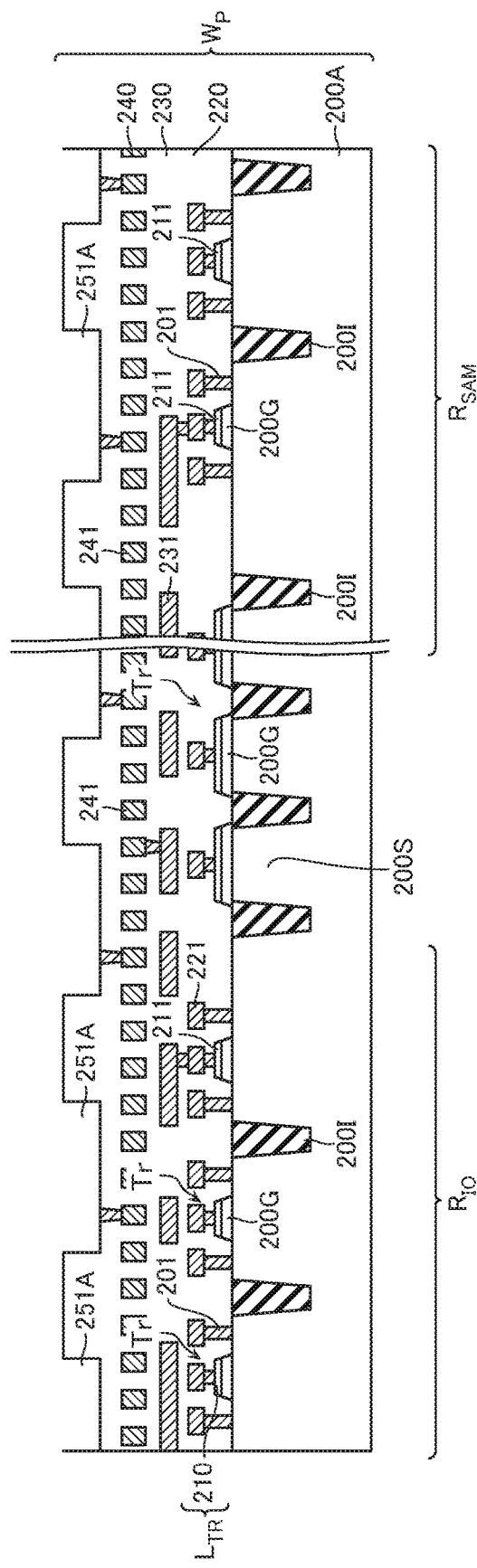
FIG. 31 is a schematic cross-sectional view for describing the same manufacturing method.

Next, for example, as illustrated in FIG. 30 and FIG. 31, trenches 251A are formed at positions corresponding to the plurality of bonding electrodes $P_{f2}$ (FIG. 9). This process is, for example, performed by photolithography and etching. Note that as illustrated in FIG. 30, the trenches 251A are formed with a uniform placement density across the entire surface of the wafer $W_P$ including on the dicing lines DL.

Figure 32:
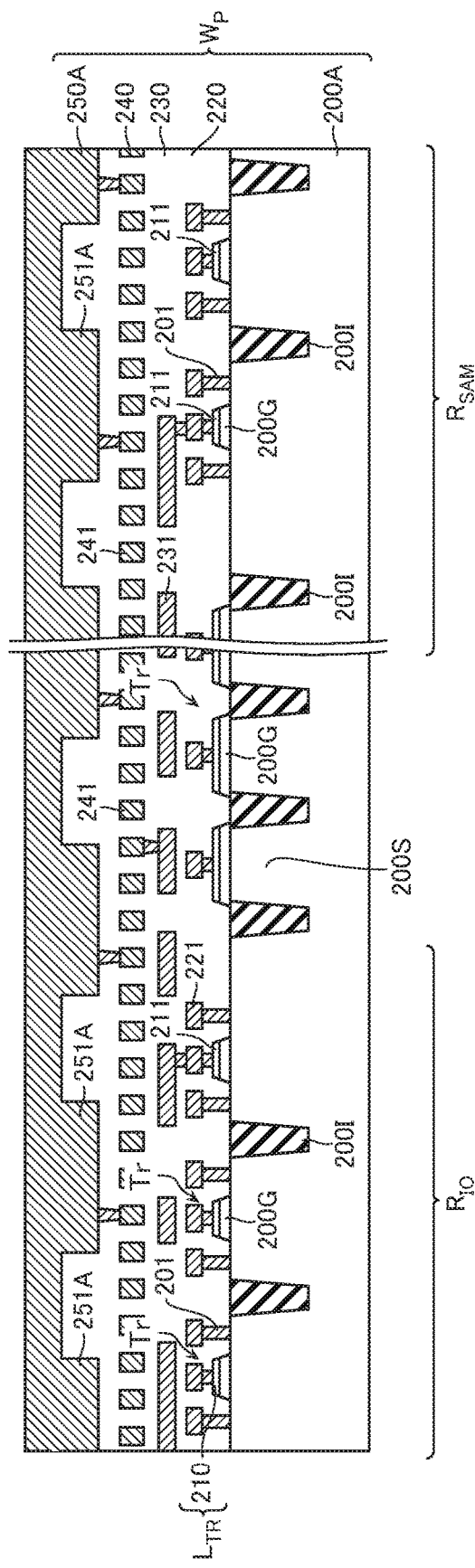
FIG. 32 is a schematic cross-sectional view for describing the same manufacturing method.

Next, for example, as illustrated in FIG. 32, a conductive layer 250A is formed on the surface of the wafer $W_P$. This process is performed by, for example, sputtering.

Figure 33:
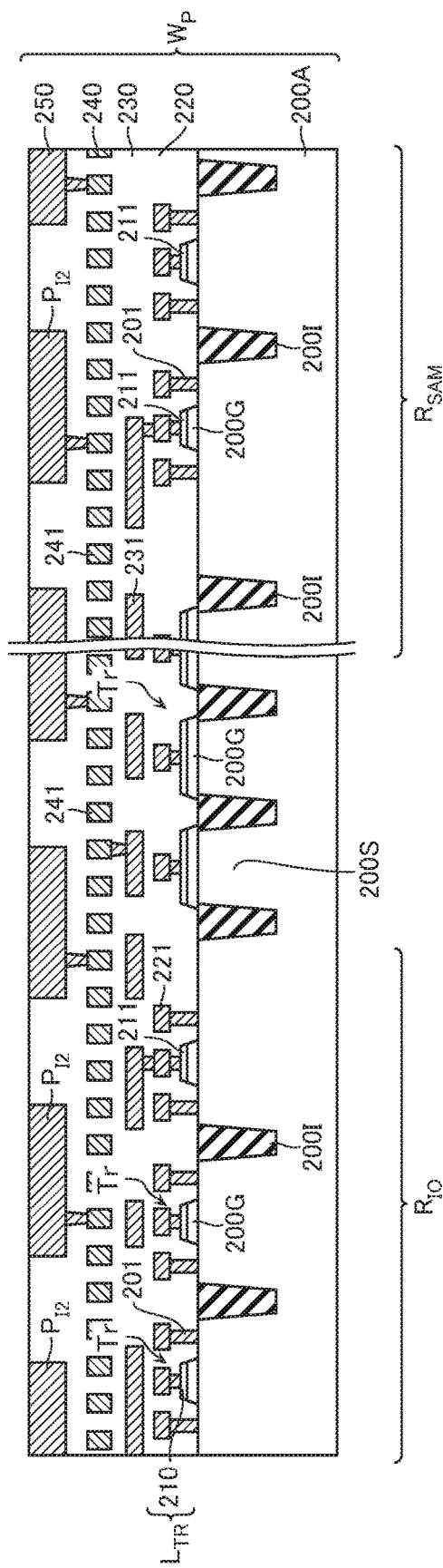
FIG. 33 is a schematic cross-sectional view for describing the same manufacturing method.

Next, for example, as illustrated in FIG. 33, the conductive layer 250A is removed with the portions formed inside the trenches 251A left. This process forms the plurality of bonding electrodes $P_{f2}$. This process is, for example, performed by CMP.

Figure 34:
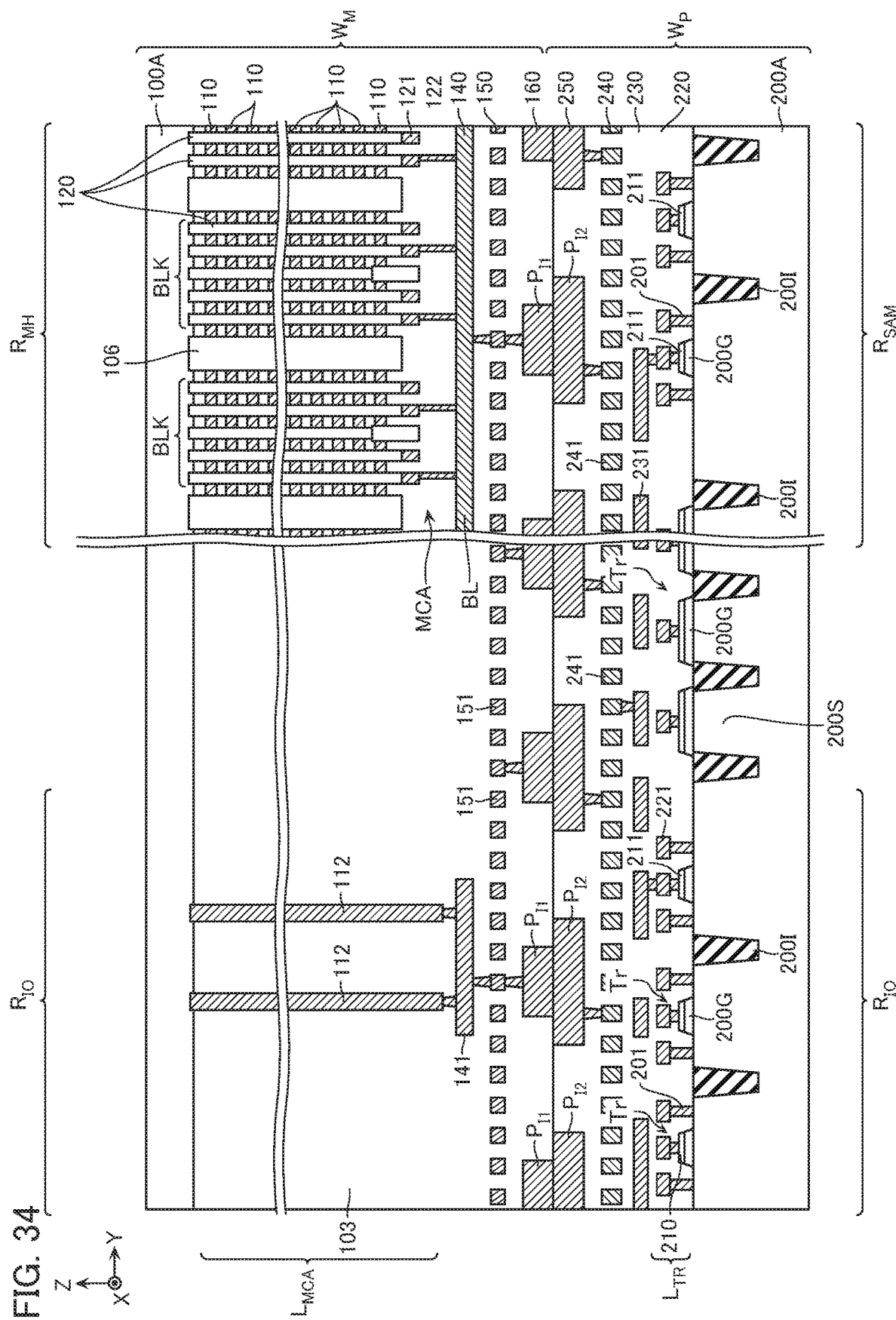
FIG. 34 is a schematic cross-sectional view for describing the same manufacturing method.

After ending the process described with reference to FIG. 23 and the process described with reference to FIG. 33, for example, as illustrated in FIG. 34, the wafer $W_M$ and the wafer $W_P$ are bonded. In this bonding process, for example, the wafer $W_M$ is pressed against the wafer $W_P$ to make the wafer $W_M$ in close contact with the wafer $W_P$ and heat treatment or the like is performed. Thus, the wafer $W_M$ is bonded to the wafer $W_P$ via the bonding electrodes $P_{f1}$ and the bonding electrodes $P_{f2}$.

Afterwards, the bonding pad electrode $P_X$ and the like described with reference to FIG. 9 are formed on the back surface (the upper surface) of the wafer $W_M$. Additionally, the wafer $W_M$ and the wafer $W_P$ are separated along the dicing lines DL (FIG. 13). Thus, the memory die MD is formed.

[Effects]

For example, in the process described with reference to FIG. 18, a part of the conductive layer 150A is removed by means, such as CMP. In the process, when the placement density of the trenches 151A in the surface of the wafer $W_M$ are non-uniform, a surface of the region where the trenches 151A are disposed with a high placement density is significantly removed, and unevenness is formed in the surface of the wafer $W_M$ in some cases.

For example, in the process described with reference to FIG. 23, a part of the conductive layer 160A is removed by means, such as CMP. In the process, when the placement density of the trenches 161A in the surface of the wafer $W_M$ are non-uniform, a surface of the region where the trenches 161A are disposed with a high placement density is significantly removed, and unevenness is formed in the surface of the wafer $W_M$ in some cases.

Here, as described with reference to FIG. 34, in the manufacturing process of the memory die MD, the wafer $W_M$ and the wafer $W_P$ are bonded. However, for example, when the placement densities of the trenches 151A, 161A in the memory hole region $R_{MH}$ are greater than the placement densities of the trenches 151A, 161A in the hook-up region $R_{HU}$, the bonding electrodes $P_{f1}$ disposed in the memory hole region $R_{MH}$ are away from the bonding electrodes $P_{f2}$ disposed in the sense amplifier module region $R_{SAM}$ and it is difficult to preferably bond them in some cases.

Therefore, in this embodiment, as described with reference to FIG. 15 and FIG. 20, the trenches 151A, 161A are formed with a uniform placement density across the entire surface of the wafer $W_M$. This method allows reducing the formation of unevenness on the surface of the wafer $W_M$ and preferably manufacturing the memory die MD.

In this embodiment, as described with reference to FIG. 25 and FIG. 30, the trenches 241A, 251A are formed with a uniform placement density across the entire surface of the wafer $W_P$. This method allows reducing the formation of unevenness on the surface of the wafer $W_P$ and preferably manufacturing the memory die MD.

In this embodiment, as described with reference to FIG. 12, the width $W_{XP2}$ in the X-direction of the bonding electrode $P_{I2}$ is greater than the width $W_{XP1}$ in the X-direction of the bonding electrode $P_{I1}$. Additionally, the width $W_{YP2}$ in the Y-direction of the bonding electrode $P_{I2}$ is greater than the width $W_{YP1}$ in the Y-direction of the bonding electrode $P_{I1}$. With this method, in the process described with reference to FIG. 34, the memory die MD can be further preferably manufactured with ensuring a margin in the X-direction and the Y-direction of misalignment between the wafer $W_M$ and the wafer $W_P$.

Second Embodiment

Figure 35:
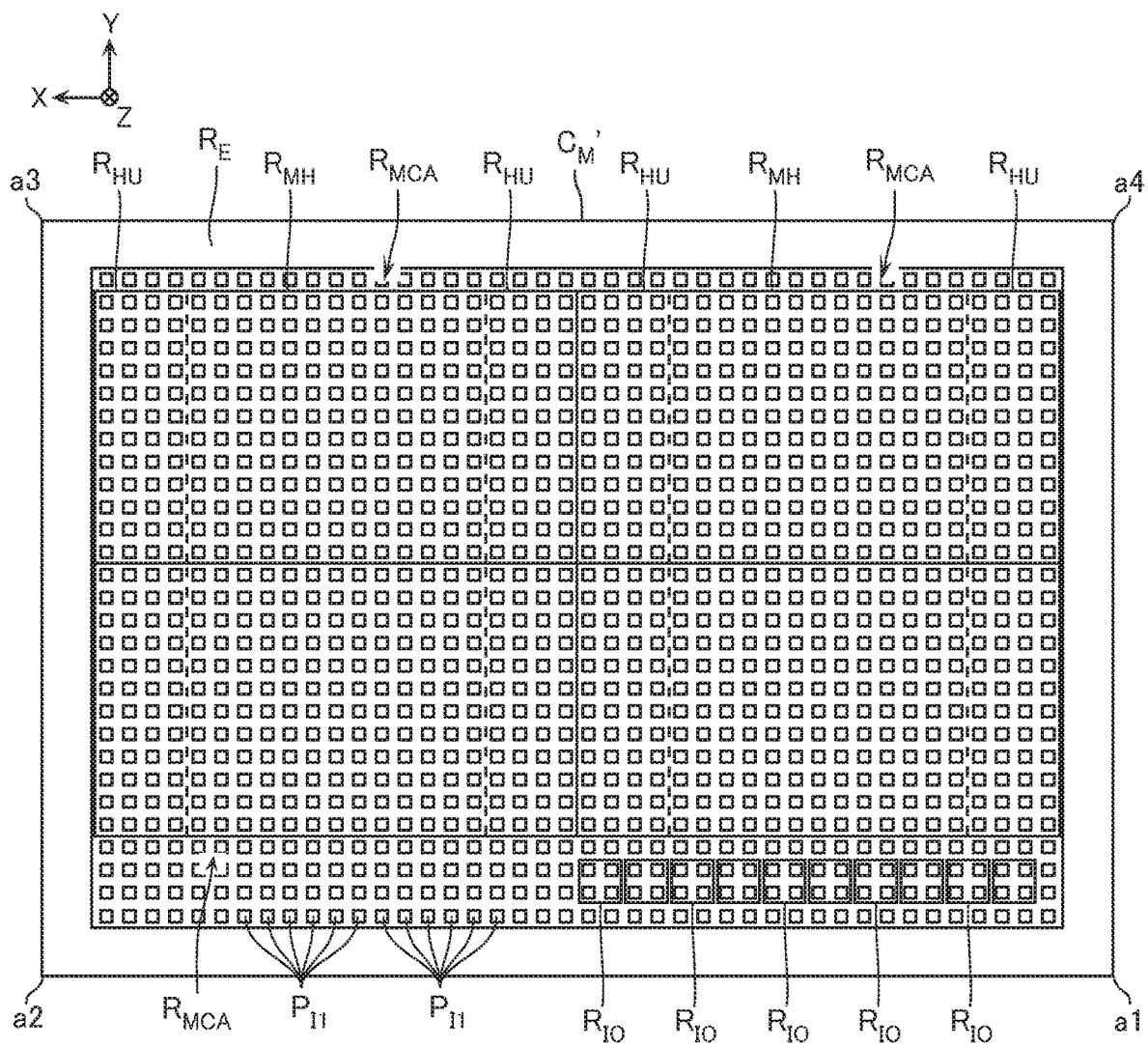
FIG. 35 is a schematic bottom view illustrating an exemplary configuration of a chip $C_M'$ according to a second embodiment.
Figure 36:
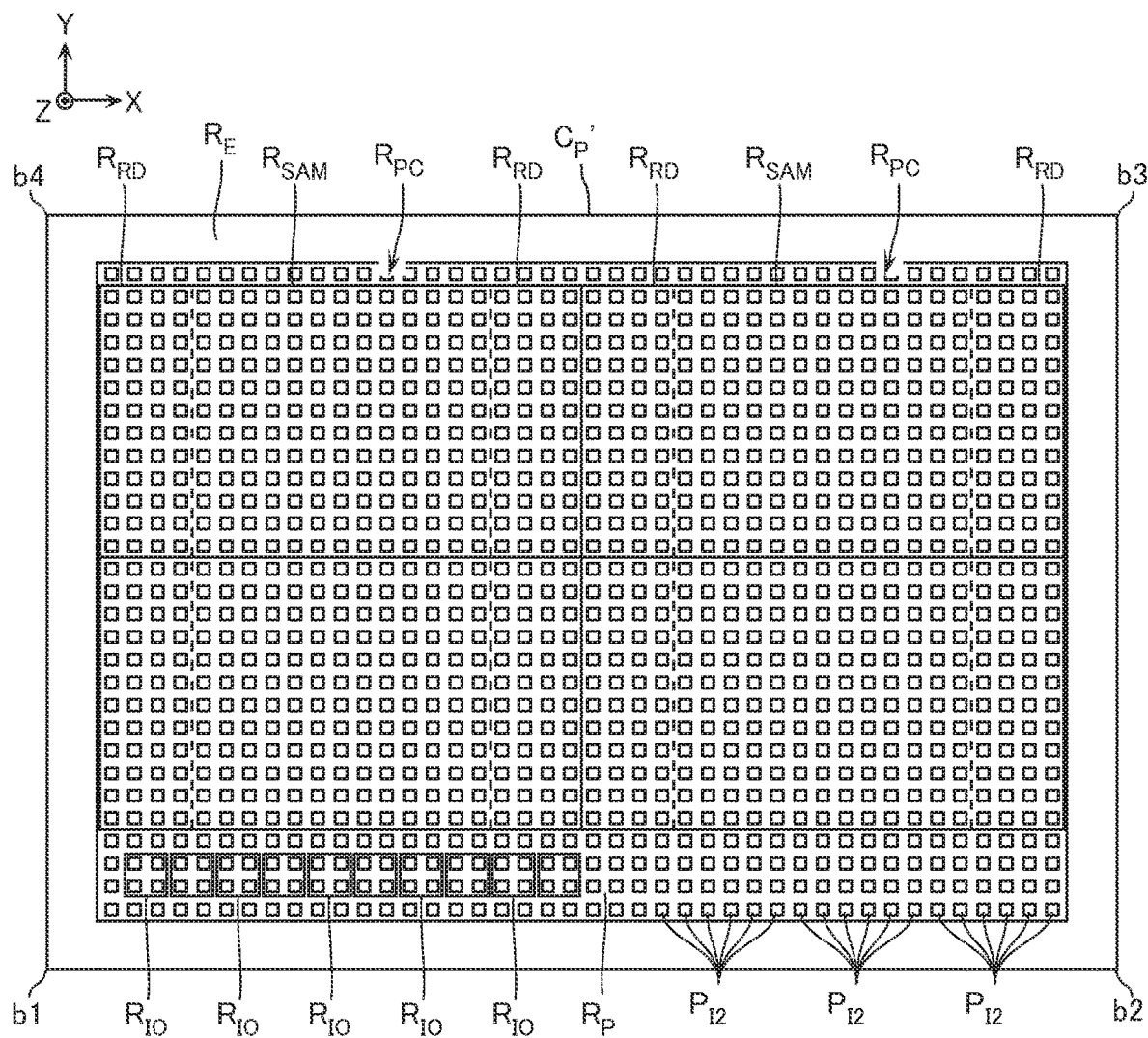
FIG. 36 is a schematic plan view illustrating an exemplary configuration of a chip $C_P'$ according to the second embodiment.

Next, with reference to FIG. 35 and FIG. 36, a semiconductor memory device according to the second embodiment will be described. FIG. 35 is a schematic bottom view illustrating an exemplary configuration of a chip $C_M'$. FIG. 36 is a schematic plan view illustrating an exemplary configuration of a chip $C_P'$.

The semiconductor memory device according to the second embodiment is configured basically similarly to the semiconductor memory device according to the first embodiment. However, the semiconductor memory device according to the second embodiment includes the chip $C_M'$ (FIG. 35) instead of the chip $C_M$. Additionally, the semiconductor memory device according to the second embodiment includes the chip $C_P'$ (FIG. 36) instead of the chip $C_P$.

The chip $C_M'$ according to the second embodiment is configured basically similarly to the chip $C_M$ according to the first embodiment. However, as illustrated in FIG. 35, the bonding electrode $P_{I1}$ is not disposed in the edge region $R_E$ of the chip $C_M'$.

The chip $C_P'$ according to the second embodiment is configured basically similarly to the chip $C_P$ according to the first embodiment. However, as illustrated in FIG. 36, the bonding electrode $P_{I2}$ is not disposed in the edge region $R_E$ of the chip $C_P'$.

The manufacturing method of the semiconductor memory device according to the second embodiment is basically similarly to the manufacturing method of the semiconductor memory device according to the first embodiment.

Figure 37:
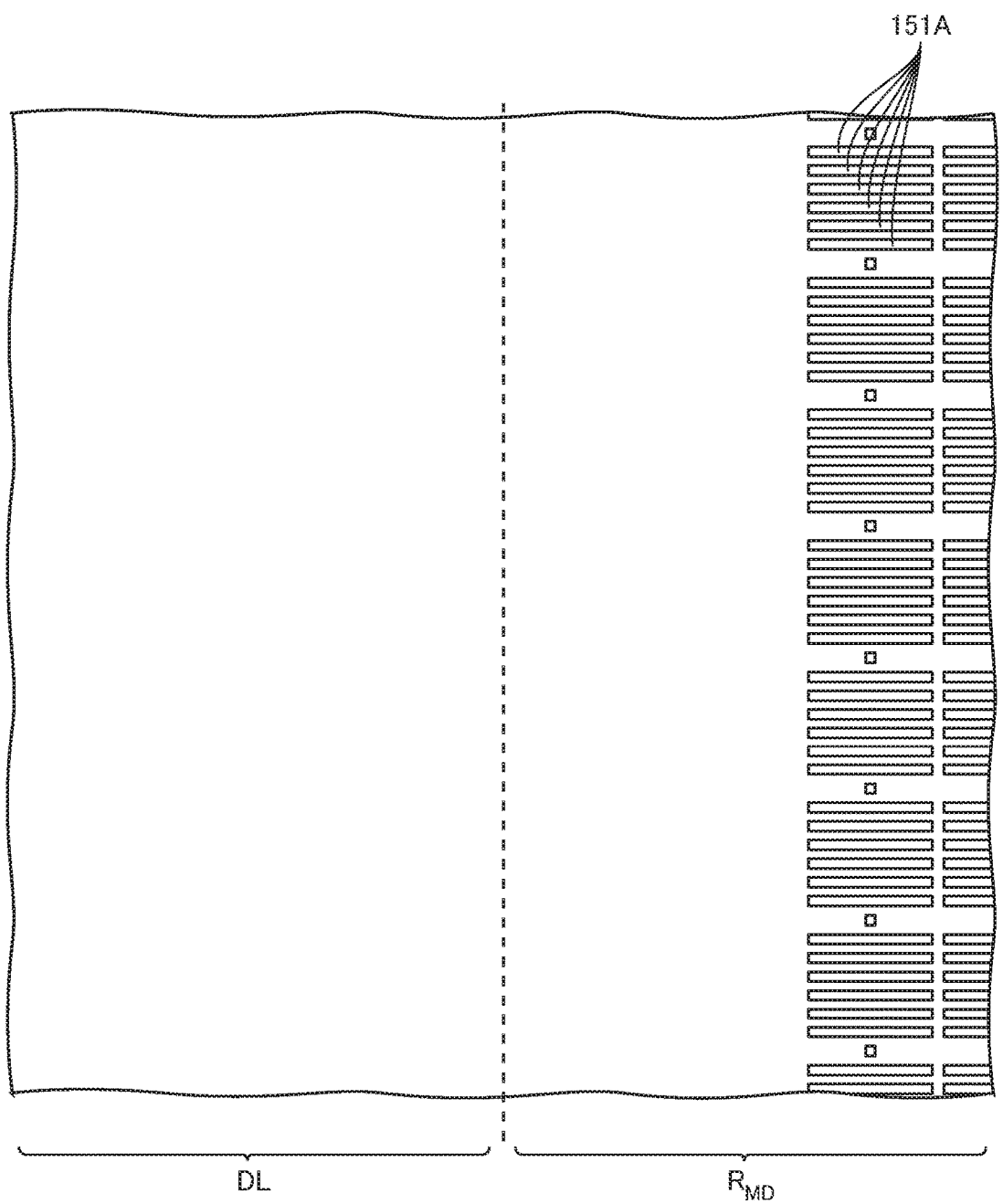
FIG. 37 is a schematic bottom view for describing a manufacturing method according to the second embodiment.

However, as described with reference to FIG. 15, in the manufacturing method of the semiconductor memory device according to the first embodiment, the trenches 151A are formed on the dicing lines DL. Meanwhile, as illustrated in FIG. 37, in the manufacturing method of the semiconductor memory device according to the second embodiment, the trench 151A is not formed on the dicing line DL.

Figure 38:
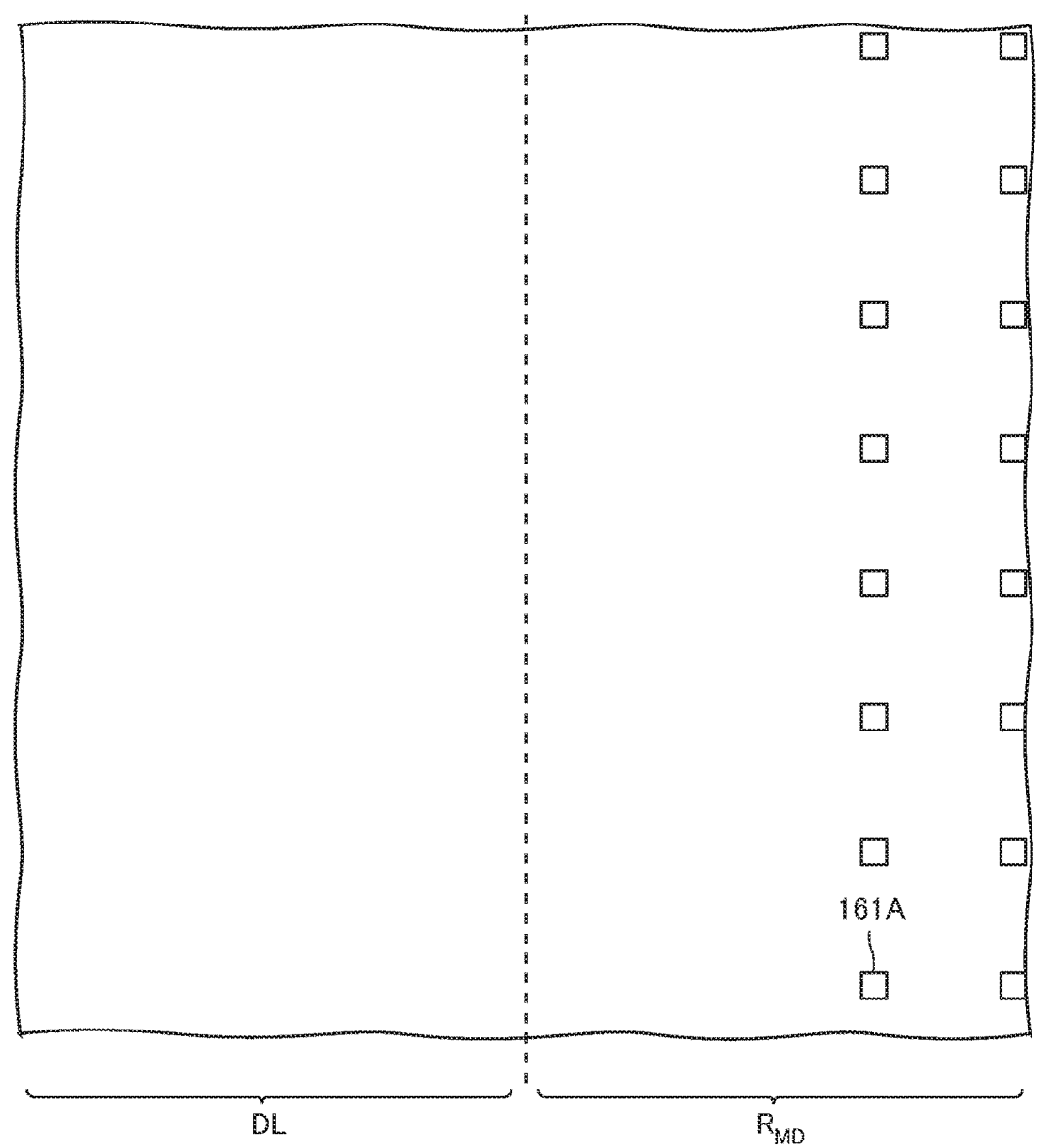
FIG. 38 is a schematic bottom view for describing the same manufacturing method.

As described with reference to FIG. 20, in the manufacturing method of the semiconductor memory device according to the first embodiment, the trenches 161A are formed on the dicing lines DL. Meanwhile, as illustrated in FIG. 38, in the manufacturing method of the semiconductor memory device according to the second embodiment, the trench 161A is not formed on the dicing line DL.

Although the illustration is omitted, in the manufacturing method of the semiconductor memory device according to the second embodiment, in the process corresponding to FIG. 30, the trench 241A is not formed on the dicing line DL. Additionally, in the process corresponding to FIG. 30, the trench 251A is not formed on the dicing line DL.

Here, in the manufacturing method of the semiconductor memory device according to the first embodiment, the wirings 151, 241 and the bonding electrodes $P_{I1}$, $P_{I2}$ are formed on the dicing lines DL. In the case, during dicing, fractions of the wirings 151, 241 and the bonding electrodes $P_{I1}$, $P_{I2}$ disposed on the dicing lines DL are scattered in some cases. Here, for example, when the wirings 151, 241 and the bonding electrodes $P_{I1}$, $P_{I2}$ contain copper (Cu) or the like, the memory die MD is contaminated by the fractions of the wirings 151, 241 and the bonding electrodes $P_{I1}$, $P_{I2}$ in some cases.

Therefore, in the manufacturing method of the semiconductor memory device according to the second embodiment, the wirings 151, 241 or the bonding electrodes $P_{I1}$, $P_{I2}$ are not formed on the dicing line DL. Thus, contamination of the memory die MD as described above can be reduced.

In the manufacturing method of the semiconductor memory device according to the second embodiment, in the process described with reference to FIG. 18, FIG. 23, FIG. 28, and FIG. 33, a surface of the memory die region $R_{MD}$ is removed larger than a surface of dicing line DL and unevenness is possibility formed on the surface of the wafer $W_M$.

Therefore, in the manufacturing method of the semiconductor memory device according to the second embodiment, similarly to the semiconductor memory device according to the first embodiment, the width $W_{XP2}$ in the X-direction of the bonding electrode $P_{I2}$ is configured to be larger than the width $W_{XP1}$ in the X-direction of the bonding electrode $P_{I1}$. Additionally, the width $W_{YP2}$ in the Y-direction of the bonding electrode $P_{I2}$ is configured to be larger than the width $W_{YP1}$ in the Y-direction of the bonding electrode $P_{I1}$.

With this method, the aspect of unevenness formed on the surface of the wafer $W_M$ can be differentiated from the aspect of unevenness formed on the surface of the wafer $W_P$. Thus, the plurality of bonding electrodes $P_{I1}$ formed on the surface of the wafer $W_M$ and the plurality of bonding electrodes $P_{I2}$ formed on the surface of the wafer $W_P$ can be preferably bonded comparatively.

Other Embodiments

The semiconductor memory devices according to the first embodiment and the second embodiment have been described above. However, such a configuration is merely an example and specific configurations are appropriately adjustable.

For example, in the semiconductor memory device according to the first embodiment, as described with reference to FIG. 5 and FIG. 7, the bonding electrodes $P_{I1}$, $P_{I2}$ are disposed on the entire edge region $R_E$. In the semiconductor memory device according to the second embodiment, as described with reference to FIG. 35 and FIG. 36, the bonding electrodes $P_{I1}$, $P_{I2}$ are not disposed in the entire edge region $R_E$. However, such a configuration is merely an example and specific configurations are appropriately adjustable.

Figure 39:
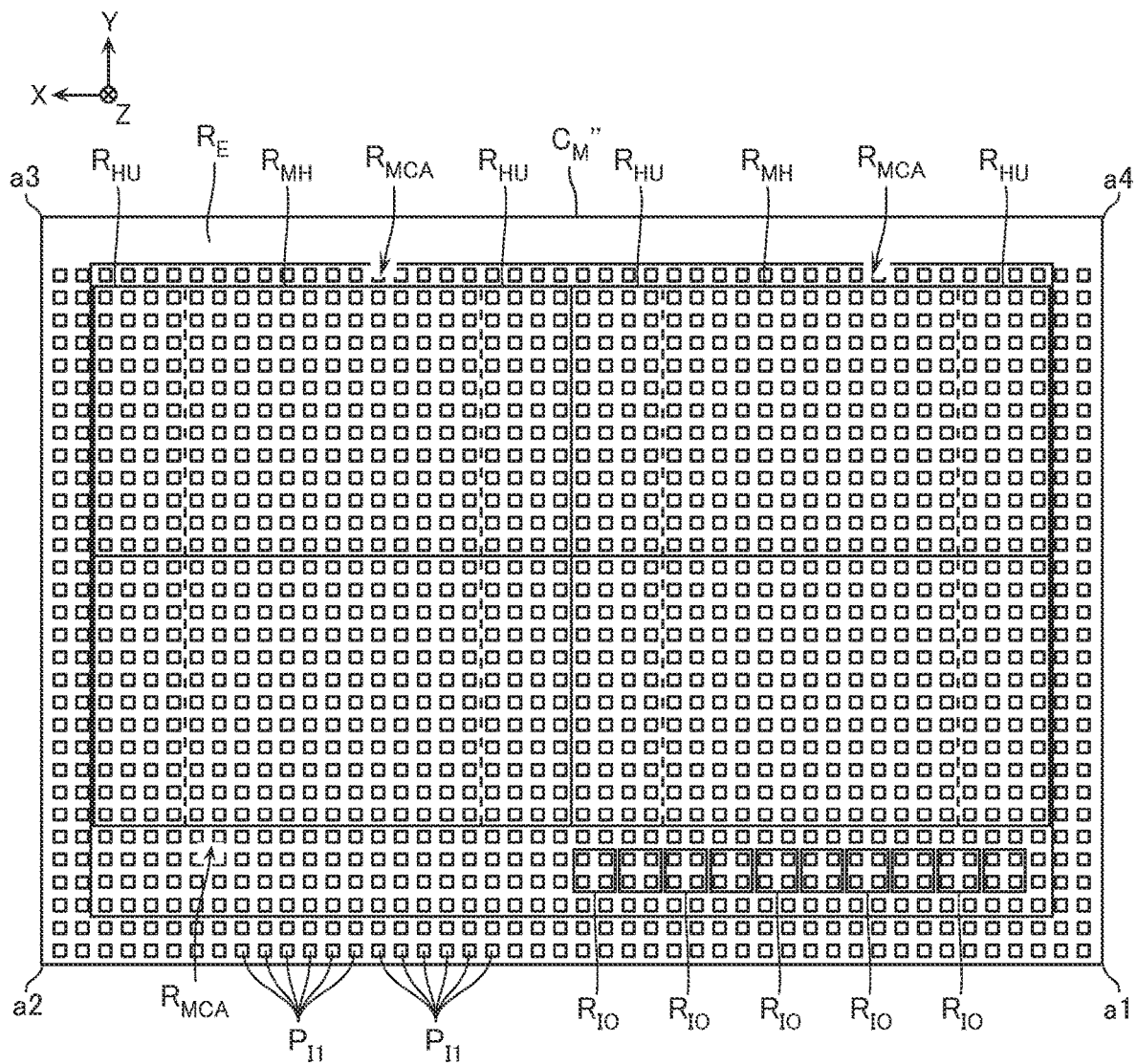
FIG. 39 is a schematic bottom view illustrating an exemplary configuration of a chip $C_M''$ according to another embodiment.
Figure 40:
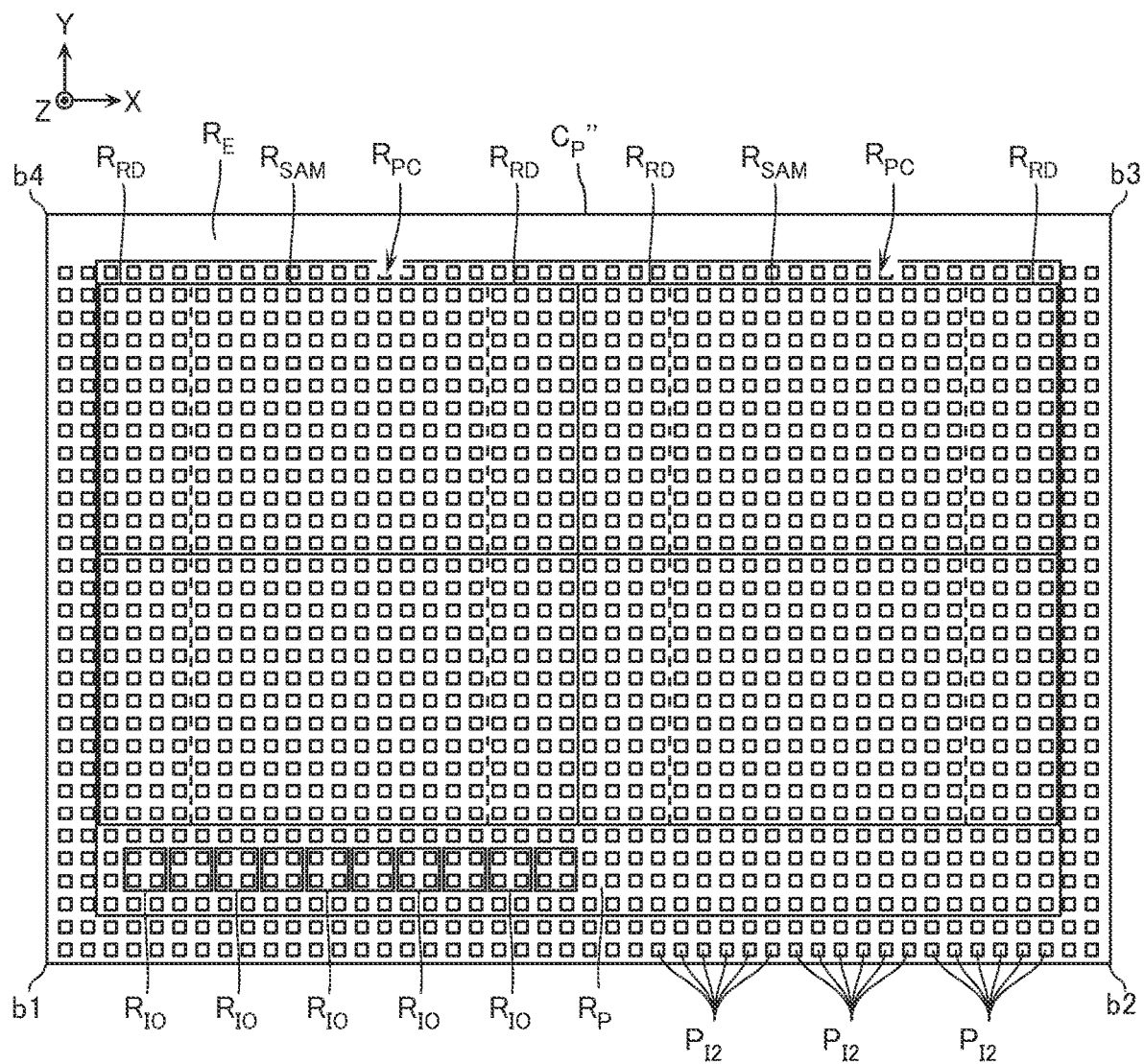
FIG. 40 is a schematic bottom view illustrating an exemplary configuration of a chip $C_P''$ according to another embodiment.
Figure 41:
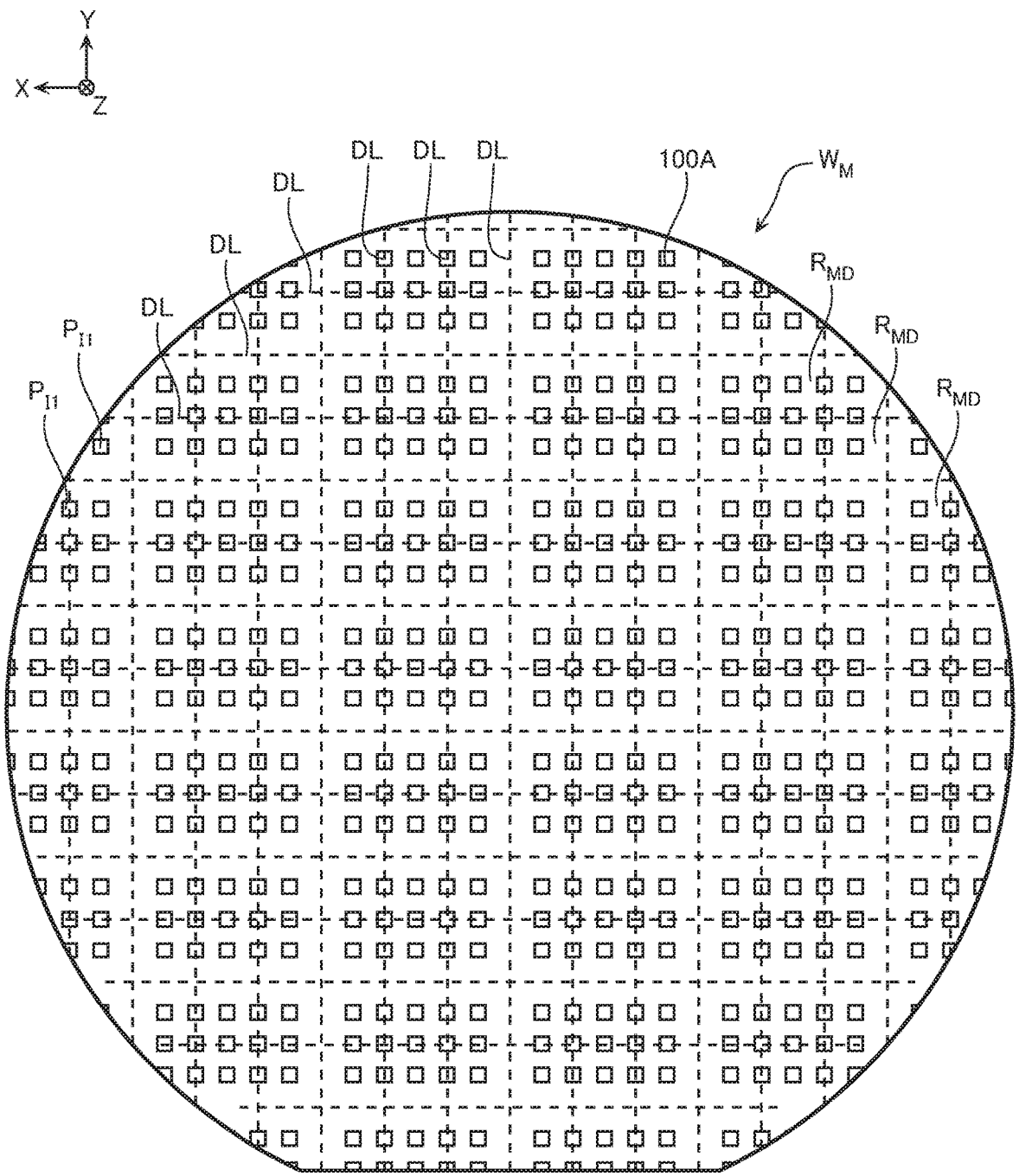
FIG. 41 is a schematic bottom view for describing a manufacturing method according to another embodiment.

For example, FIG. 39 and FIG. 40 illustrate an example of a configuration in which the bonding electrodes $P_{I1}$, $P_{I2}$ are disposed in a part of the edge region $R_E$ and the bonding electrodes $P_{I1}$, $P_{I2}$ are not disposed in a part of the edge region $R_E$. Note that in the example of FIG. 39 and FIG. 40, in the edge region $R_E$, the bonding electrodes $P_{I1}$, $P_{I2}$ are not disposed in the portion disposed on one side in the Y-direction of the memory die MD and the bonding electrodes $P_{I1}$, $P_{I2}$ are disposed in the region other than that. However, such a configuration is merely an example and specific configurations are appropriately adjustable. In manufacturing such a configuration, for example, as illustrated in FIG. 41, it is considered that the bonding electrodes $P_{I1}$, $P_{I2}$ are disposed on a part of the dicing lines DL and the bonding electrodes $P_{I1}$, $P_{I2}$ are not disposed on a part of the dicing lines DL.

For example, the wirings 151, 241 are disposed in the edge region $R_E$ in the semiconductor memory device according to the first embodiment. Additionally, for example, in the semiconductor memory device according to the second embodiment, the wirings 151, 241 are not disposed in the edge region $R_E$. However, such a configuration is merely an example and specific configurations are appropriately adjustable. For example, at least one of the wirings 151 and the wirings 241 may be omitted in the edge region $R_E$ in the semiconductor memory device according to the first embodiment, and at least one of the wirings 151 and the wirings 241 may be disposed in the edge region $R_E$ in the semiconductor memory device according to the second embodiment.

For example, in the first embodiment and the second embodiment, all of the wirings 151, 241 extend in the X-direction. However, such a configuration is merely an example and specific configurations are appropriately adjustable. For example, in the semiconductor memory device according to the first embodiment or the second embodiment, at least one of the wirings 151 and the wirings 241 can be wirings extending in the Y-direction.

For example, in the first embodiment and the second embodiment, the two chips (such as the chip $C_M$ and the chip $C_P$) are bonded via the bonding electrodes. However, such a configuration is merely an example and specific configurations are appropriately adjustable.

Figure 42:
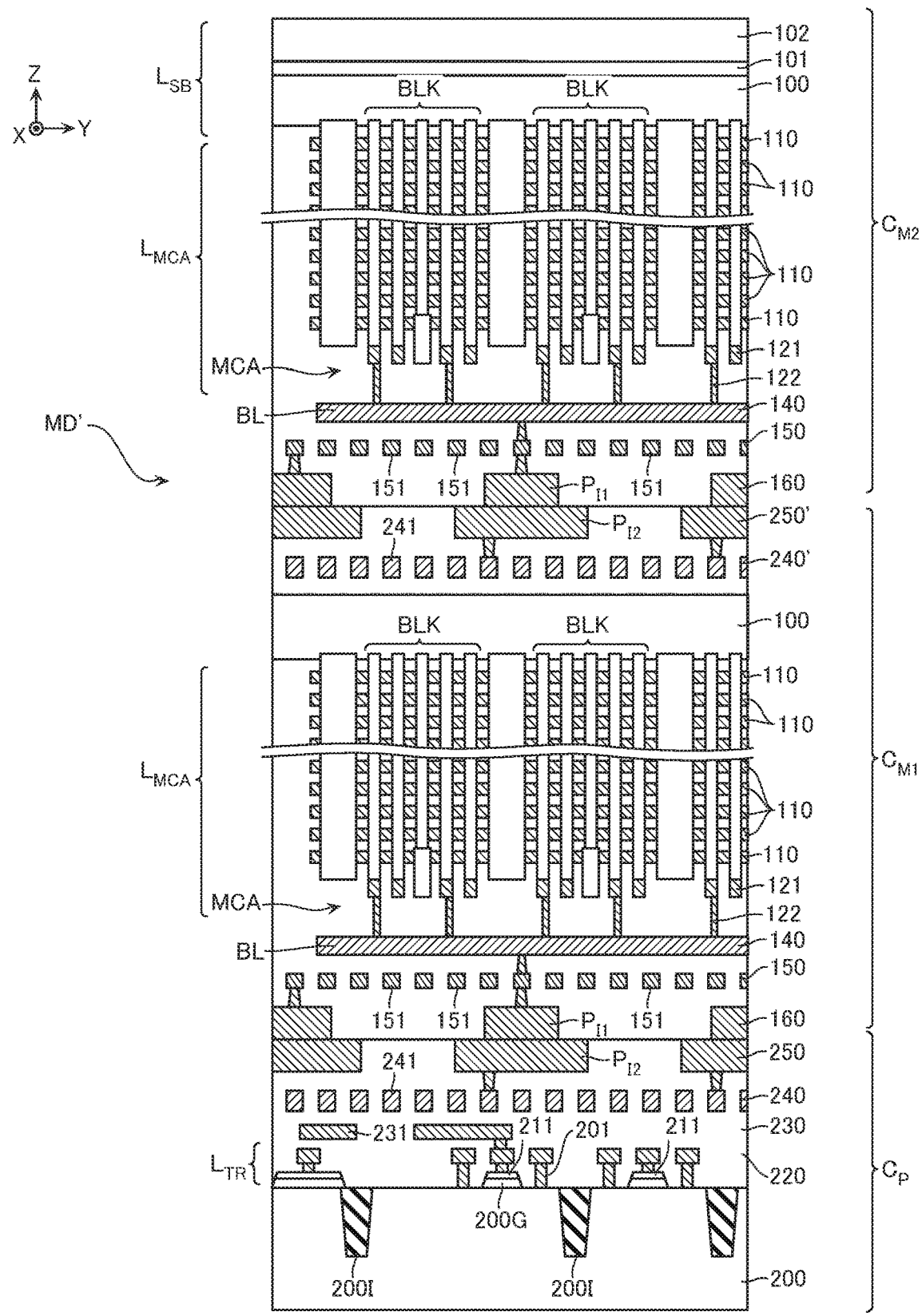
FIG. 42 is a schematic cross-sectional view illustrating an exemplary configuration of a memory die MD' according to another embodiment.

For example, a memory die MD' illustrated in FIG. 42 as an example includes three chips $C_P$, $C_{M1}$, $C_{M2}$ connected to one another. The chip $C_{M1}$, $C_{M2}$ are configured almost similarly to the chip $C_M$ or chip $C_M'$. However, the substrate layer $L_{SB}$ is not disposed on the upper surface of the chip $C_{M1}$, and instead of it, wiring layers 240', 250' are disposed. These wiring layers 240', 250' are configured approximately similarly to the wiring layers 240, 250.

For example, in the first embodiment and the second embodiment, as described with reference to FIG. 11, the width $W_{XP2}$ in the X-direction of the bonding electrode $P_{I2}$ is larger than the width $W_{XP1}$ in the X-direction of the bonding electrode $P_{I1}$. Additionally, the width $W_{YP2}$ in the Y-direction of the bonding electrode $P_{I2}$ is larger than the width $W_{YP1}$ in the Y-direction of the bonding electrode $P_{I1}$. However, for example, the width $W_{XP2}$ in the X-direction of the bonding electrode $P_{I2}$ may be smaller than the width $W_{XP1}$ in the X-direction of the bonding electrode $P_{I1}$. Additionally, the width $W_{YP2}$ in the Y-direction of the bonding electrode $P_{I2}$ may be smaller than the width $W_{YP1}$ in the Y-direction of the bonding electrode $P_{I1}$.

[Others]

While some embodiments of the present invention have been described above, these embodiments have been presented by way of example only, and are not intended to limit the scope of the inventions. These novel embodiments described herein can be embodied in a variety of other configurations, and various omissions, substitutions, and changes can be made without departing from the gist of the inventions. The inventions described in claims and their equivalents are intended to cover these embodiments and modifications as would fall within the scope and the gist of the inventions.

What is claimed is:

1. A semiconductor memory device comprising:
   a first chip and a second chip bonded via a plurality of bonding electrodes, wherein
   the first chip includes a first region and a second region,
   the first region includes:
      a plurality of memory cells;
      a plurality of bit lines connected to the plurality of memory cells;
      a plurality of word lines connected to the plurality of memory cells; and
      a plurality of first bonding electrodes that are a part of the plurality of bonding electrodes and electrically connected to the plurality of bit lines,
   the second region includes:
      a plurality of contacts electrically connected to the plurality of word lines; and
      a plurality of second bonding electrodes that are a part of the plurality of bonding electrodes and electrically connected to the plurality of contacts,
   the plurality of first bonding electrodes include a third bonding electrode and a fourth bonding electrode adjacent in a first direction,
   the plurality of second bonding electrodes include a fifth bonding electrode and a sixth bonding electrode adjacent in the first direction, and
   a distance from a center position in the first direction of the third bonding electrode to a center position in the first direction of the fourth bonding electrode and a distance from a center position in the first direction of the fifth bonding electrode to a center position in the first direction of the sixth bonding electrode are matched in a range of from 90% to 110%.

2. The semiconductor memory device according to claim 1, wherein
   the plurality of first bonding electrodes and the plurality of second bonding electrodes are:
      arranged in the first direction at a first arrangement period; and
      arranged in a second direction intersecting with the first direction at a second arrangement period.

3. The semiconductor memory device according to claim 2, wherein
   the first region includes a plurality of first wirings disposed between the plurality of bit lines and the plurality of first bonding electrodes,
   the second region includes a plurality of second wirings disposed between the plurality of contacts and the plurality of second bonding electrodes, and
   the plurality of first wirings and the plurality of second wirings are arranged in the first direction at an arrangement period 1/n (n is an integer of one or more) times of the first arrangement period or arranged in the second direction at an arrangement period 1/n times of the second arrangement period.

4. The semiconductor memory device according to claim 1, wherein
   the first chip includes a third region disposed along at least a part of an outer periphery of the first chip, the third region includes a plurality of seventh bonding electrodes that are a part of the plurality of bonding electrodes,
the plurality of first bonding electrodes are:
arranged in the first direction at a first arrangement period; and
arranged in a second direction intersecting with the first direction at a second arrangement period, and
the plurality of seventh bonding electrodes are:
arranged in the first direction at the first arrangement period; and
arranged in the second direction at the second arrangement period.

5. The semiconductor memory device according to claim 2, wherein
the first chip includes a third region disposed along at least a part of an outer periphery of the first chip,
the third region includes a plurality of seventh bonding electrodes that are a part of the plurality of bonding electrodes, and
the plurality of seventh bonding electrodes are:
arranged in the first direction at the first arrangement period; and
arranged in the second direction at the second arrangement period.

6. The semiconductor memory device according to claim 3, wherein
the first chip includes a third region disposed along at least a part of an outer periphery of the first chip,
the third region includes a plurality of seventh bonding electrodes that are a part of the plurality of bonding electrodes, and
the plurality of seventh bonding electrodes are:
arranged in the first direction at the first arrangement period; and
arranged in the second direction at the second arrangement period.

7. The semiconductor memory device according to claim 1, wherein
the second chip includes a fourth region and a fifth region,
the fourth region includes a plurality of eighth bonding electrodes that are a part of the plurality of bonding electrodes and disposed corresponding to the plurality of first bonding electrodes,
the fifth region includes a plurality of ninth bonding electrodes that are a part of the plurality of bonding electrodes and disposed corresponding to the plurality of second bonding electrodes, and
the plurality of eighth bonding electrodes and the plurality of ninth bonding electrodes have first sizes in the first direction larger than second sizes in the first direction of the plurality of first bonding electrodes and the plurality of second bonding electrodes, or the first sizes are smaller than the second sizes.

8. The semiconductor memory device according to claim 2, wherein
the second chip includes a fourth region and a fifth region,
the fourth region includes a plurality of eighth bonding electrodes that are a part of the plurality of bonding electrodes and disposed corresponding to the plurality of first bonding electrodes,
the fifth region includes a plurality of ninth bonding electrodes that are a part of the plurality of bonding electrodes and disposed corresponding to the plurality of second bonding electrodes, and
the plurality of eighth bonding electrodes and the plurality of ninth bonding electrodes have first sizes in the first direction larger than second sizes in the first direction of the plurality of first bonding electrodes and the plurality of second bonding electrodes, or the first sizes are smaller than the second sizes.

9. The semiconductor memory device according to claim 3, wherein
the second chip includes a fourth region and a fifth region,
the fourth region includes a plurality of eighth bonding electrodes that are a part of the plurality of bonding electrodes and disposed corresponding to the plurality of first bonding electrodes,
the fifth region includes a plurality of ninth bonding electrodes that are a part of the plurality of bonding electrodes and disposed corresponding to the plurality of second bonding electrodes, and
the plurality of eighth bonding electrodes and the plurality of ninth bonding electrodes have first sizes in the first direction larger than second sizes in the first direction of the plurality of first bonding electrodes and the plurality of second bonding electrodes, or the first sizes are smaller than the second sizes.

10. The semiconductor memory device according to claim 4, wherein
the second chip includes a fourth region and a fifth region,
the fourth region includes a plurality of eighth bonding electrodes that are a part of the plurality of bonding electrodes and disposed corresponding to the plurality of first bonding electrodes,
the fifth region includes a plurality of ninth bonding electrodes that are a part of the plurality of bonding electrodes and disposed corresponding to the plurality of second bonding electrodes, and
the plurality of eighth bonding electrodes and the plurality of ninth bonding electrodes have first sizes in the first direction larger than second sizes in the first direction of the plurality of first bonding electrodes and the plurality of second bonding electrodes, or the first sizes are smaller than the second sizes.

11. The semiconductor memory device according to claim 1, wherein
the second chip includes a fourth region and a fifth region,
the fourth region includes a plurality of eighth bonding electrodes that are a part of the plurality of bonding electrodes and disposed corresponding to the plurality of first bonding electrodes,
the fifth region includes a plurality of ninth bonding electrodes that are a part of the plurality of bonding electrodes and disposed corresponding to the plurality of second bonding electrodes,
the plurality of eighth bonding electrodes include a tenth bonding electrode and an eleventh bonding electrode adjacent in the first direction,
the plurality of ninth bonding electrodes include a twelfth bonding electrode and a thirteenth bonding electrode adjacent in the first direction, and
a distance from a center position in the first direction of the tenth bonding electrode to a center position in the first direction of the eleventh bonding electrode and a distance from a center position in the first direction of the twelfth bonding electrode to a center position in the first direction of the thirteenth bonding electrode are matched in a range of from 90% to 110%.

12. The semiconductor memory device according to claim 2, wherein
the second chip includes a fourth region and a fifth region, the fourth region includes a plurality of eighth bonding electrodes that are a part of the plurality of bonding electrodes and disposed corresponding to the plurality of first bonding electrodes, the fifth region includes a plurality of ninth bonding electrodes that are a part of the plurality of bonding electrodes and disposed corresponding to the plurality of second bonding electrodes, and the plurality of eighth bonding electrodes and the plurality of ninth bonding electrodes are:
- arranged in the first direction at the first arrangement period; and
- arranged in the second direction at the second arrangement period.

13. The semiconductor memory device according to claim 12, wherein
the fourth region and the fifth region include a plurality of transistors,
the fourth region includes a plurality of third wirings disposed between the plurality of transistors and the plurality of eighth bonding electrodes,
the fifth region includes a plurality of fourth wirings disposed between the plurality of transistors and the plurality of ninth bonding electrodes, and
the plurality of third wirings and the plurality of fourth wirings are arranged in the first direction at an arrangement period 1/m (m is an integer of one or more) times of the first arrangement period or arranged in the second direction at an arrangement period 1/m times of the second arrangement period.

14. The semiconductor memory device according to claim 3, wherein
the second chip includes a fourth region,
the fourth region includes a plurality of eighth bonding electrodes that are a part of the plurality of bonding electrodes and disposed corresponding to the plurality of first bonding electrodes,
the second chip includes a sixth region disposed along at least a part of an outer periphery of the second chip,
the sixth region includes a plurality of fourteenth bonding electrodes that are a part of the plurality of bonding electrodes,
the plurality of eighth bonding electrodes are:
- arranged in the first direction at the first arrangement period; and
- arranged in the second direction at the second arrangement period, and the plurality of fourteenth bonding electrodes are:
- arranged in the first direction at the first arrangement period; and
- arranged in the second direction at the second arrangement period.

15. The semiconductor memory device according to claim 1, wherein
the first chip includes a third region disposed along at least a part of an outer periphery of the first chip, and
the plurality of bonding electrodes are not disposed in the third region.

16. The semiconductor memory device according to claim 15, wherein
the second chip includes a sixth region disposed along at least a part of an outer periphery of the second chip, and
the plurality of bonding electrodes are not disposed in the sixth region.

* * * * *